United States Patent
Isojima et al.

(10) Patent No.: US 12,242,095 B2
(45) Date of Patent: Mar. 4, 2025

(54) OPTICAL FILM, POLARIZING PLATE, SURFACE PLATE FOR IMAGE DISPLAY DEVICE, AND IMAGE DISPLAY DEVICE

(71) Applicant: DAI NIPPON PRINTING CO., LTD., Tokyo (JP)

(72) Inventors: Seiichi Isojima, Okayama (JP); Junya Eguchi, Okayama (JP); Takashi Kuroda, Moriya (JP); Hiroki Nakagawa, Okayama (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 906 days.

(21) Appl. No.: 17/292,918

(22) PCT Filed: Nov. 13, 2019

(86) PCT No.: PCT/JP2019/044475
§ 371 (c)(1),
(2) Date: Aug. 5, 2021

(87) PCT Pub. No.: WO2020/100926
PCT Pub. Date: May 22, 2020

(65) Prior Publication Data
US 2021/0405272 A1 Dec. 30, 2021

(30) Foreign Application Priority Data
Nov. 13, 2018 (JP) .................................. 2018-213238

(51) Int. Cl.
*G02B 5/20* (2006.01)
*G02B 1/04* (2006.01)
(Continued)

(52) U.S. Cl.
CPC ............. *G02B 5/3075* (2013.01); *G02B 1/04* (2013.01); *G02B 5/283* (2013.01); *G02B 5/3033* (2013.01);
(Continued)

(58) Field of Classification Search
CPC . G02B 1/00; G02B 1/04; G02B 1/045; G02B 1/08; G02B 1/10; G02B 1/11;
(Continued)

(56) References Cited

U.S. PATENT DOCUMENTS

| 6,589,649 B2 * | 7/2003 | Oya ........................ C09J 7/255 |
| | | 313/461 |
| 2016/0064958 A1 * | 3/2016 | Jung ................. H02J 7/007192 |
| | | 320/134 |

FOREIGN PATENT DOCUMENTS

| JP | 2003-195053 | 7/2003 |
| JP | 2011-112928 | 6/2011 |

(Continued)

OTHER PUBLICATIONS

International Search Report of PCT/JP2019/044475, Jan. 21, 2020, 5 pages including English translation of the International Search Report.

*Primary Examiner* — Thong Q Nguyen
(74) *Attorney, Agent, or Firm* — HSML P.C.

(57) ABSTRACT

Provided is an optical film that, when being incorporated into an image display device, can suppress the image display device from appearing pale. An optical film including a UV-absorbing layer containing a UV-absorbing agent B on a plastic film containing a UV-absorbing agent A, wherein fluorescence emission when the plastic film side is irradiated with excitation light having a wavelength of 365 nm and fluorescence emission when the UV-absorbing layer side is (Continued)

irradiated with excitation light having a wavelength of 365 nm satisfy a specific condition.

15 Claims, 4 Drawing Sheets

(51) Int. Cl.
    *G02B 5/28*     (2006.01)
    *G02B 5/30*     (2006.01)
    *G09F 9/30*     (2006.01)
    *G02F 1/1335*     (2006.01)

(52) U.S. Cl.
    CPC ........ *G09F 9/301* (2013.01); *G02F 1/133509* (2013.01); *G02F 1/133528* (2013.01)

(58) Field of Classification Search
    CPC ........... G02B 1/111; G02B 1/115; G02B 1/14; G02B 5/00; G02B 5/003; G02B 5/0268; G02B 5/0273; G02B 5/0284; G02B 5/0289; G02B 5/0294; G02B 5/08; G02B 5/0816; G02B 5/0825; G02B 5/0841; G02B 5/0866; G02B 5/0891; G02B 5/1838; G02B 5/189; G02B 5/208; G02B 5/22; G02B 5/223; G02B 5/226; G02B 5/26; G02B 5/283; G02B 5/30; G02B 5/3025; G02B 5/3033; G02B 5/3041; G02B 5/305; G02B 5/3066; G02B 5/3075; G02B 5/3083; G02B 5/3091
    USPC .................................. 359/350–361, 577–598
See application file for complete search history.

(56) References Cited

FOREIGN PATENT DOCUMENTS

| WO | 2009/150992 | 12/2009 |
|----|-------------|---------|
| WO | 2011/162198 | 12/2011 |

\* cited by examiner (A)

(B)

(C)

OPTICAL FILM, POLARIZING PLATE, SURFACE PLATE FOR IMAGE DISPLAY DEVICE, AND IMAGE DISPLAY DEVICE

TECHNICAL FIELD

The present invention relates to an optical film, a polarizing plate, a surface plate for an image display device, and an image display device.

BACKGROUND ART

In most cases, various plastic films are used on display elements of image display devices. For image display devices including a polarizing plate on a display element, for example, in order to protect a polarizer constituting the polarizing plate, plastic films (polarizer-protecting films) for protection of both surfaces of the polarizer are used.

Optical films for image display devices, as typified by polarizer-protecting films, are those including a plastic film such as a polyester film, an acrylic film, a cycloolefin-based film, and a triacetylcellulose film as a base material, and, as necessary, a functional layer on the base material.

While plastic films serve as a base material of an optical film, a plastic film containing a UV-absorbing agent kneaded therein to reduce temporal degradation due to ultraviolet rays has been proposed (PTL 1).

CITATION LIST

Patent Literature

PTL 1: International Publication No. WO 2011/162198 (claim 9)

Technical Problem

The plastic film according to PTL 1 can provide good light resistance by the UV-absorbing agent.

SUMMARY OF THE INVENTION

On the other hand, high-resolution upgrading of image display devices has been recently progressing rapidly, and full high vision (number of pixels: 1920×1080 or more) and 4K (number of pixels: 3840×2160 or more) have begun to be implemented. It is preferred for such high-resolution image display devices to have large screen size.

If a high-resolution image display device includes a plastic film containing a UV-absorbing agent kneaded therein, however, the edge region of the screen appears pale in some cases when the power is off or when showing a black screen, even without the occurrence of temporal degradation due to ultraviolet rays.

Solution to Problem

The present inventors diligently studied to solve the above-mentioned problem to find that the cause of the problem is that at least either one of a resin component constituting a plastic film and a UV-absorbing agent contained in a plastic film absorbs light in an ultraviolet wavelength region and emits fluorescence in a visible short wavelength region. Eventually, the present inventors solved the problem by daring to form a UV-absorbing layer containing a UV-absorbing agent on a plastic film containing a UV-absorbing agent kneaded therein.

The problem is inferred to become likely to arise as follows.

First, when an image display device is placed along a wall in a living room, it follows that a window is present in the horizontal direction of the image display device and sunlight enters from the horizontal direction of the image display device. In this case, as the image display device is placed more apart from the window, the angle of incidence of sunlight becomes smaller and the length of the pathway of sunlight passing through the plastic film becomes larger, and hence the intensity of fluorescence emission around an edge portion of the screen is inferred to be enhanced (this edge portion principally refers to an edge portion either in the right or in the left; of the edge portions in the right and left, the edge portion more distant from the window tends to have enhanced intensity of fluorescence emission). In particular, since high-resolution image display devices have large screen size, the intensity of fluorescence emission around an edge portion of the screen tends to be enhanced. Among plastic films, thick plastic films tend to cause enhanced intensity of fluorescence emission. Among plastic films, polyester films tend to cause enhanced intensity of fluorescence emission because the resin component polyester tends to emit fluorescence.

For image display devices of curved shape (rollable type) and foldable image display devices, a part of the screen appears pale in some cases even in an environment differing from the above-described specific environment (an environment in which sunlight enters from the horizontal direction of the image display device) or even in the case that the screen size is small. The cause is inferred to be that for image display devices of curved shape and foldable image display devices, light from outside often enters the display screen at a smaller angle than in the case of flat image display devices (it is inferred that the length of the pathway of sunlight passing through the plastic film is large at a position where light from outside enters at a small angle, and the intensity of fluorescence emission at the position is enhanced).

Fluorescence emission is evenly scattered, and hence when a plastic film emits fluorescence, the fluorescence emission is visible to a person even when the person is in a direction apart from the direction of the specular reflection of light incident on the screen.

The present invention provides an optical film, a polarizing plate, a surface plate for an image display device, and an image display device as follows.

[1] An optical film including a UV-absorbing layer containing a UV-absorbing agent B on a plastic film containing a UV-absorbing agent A, and satisfying the following condition 1:

<Condition 1> the vertical direction with respect to the plane of the optical film is defined as 0 degrees;

the surface of the optical film on the plastic film side is irradiated with excitation light having a wavelength of 365 nm from a direction of +45 degrees using a spectrofluorometer, emitted fluorescence is measured from a direction of −45 degrees, and the sum of intensities of the fluorescence from 380 nm to 490 nm is defined as BL1;

the surface of the optical film on the UV-absorbing layer side is irradiated with excitation light having a wavelength of 365 nm from a direction of +45 degrees using a spectrofluorometer, emitted fluorescence is measured from a direction of −45 degrees, and the sum of intensities of the fluorescence from 380 nm to 490 nm is defined as SL1; and under the foregoing premises, BL1 and SL1 satisfy the following formula (1):

$$SL1/BL1 \leq 0.30 \tag{1}$$

[2] A polarizing plate including: a polarizer; a transparent protective plate A disposed on one side of the polarizer; and a transparent protective plate B disposed on the other side of the polarizer, wherein at least one of the transparent protective plate A and the transparent protective plate B is the optical film according to [1], and the optical film is disposed in such a manner that, with respect to the plastic film, the surface of the optical film on the UV-absorbing layer side faces the opposite side of the polarizer.

[3] A surface plate for an image display device, the surface plate being formed by laminating an optical film on a resin plate or a glass plate, wherein the optical film is the optical film according to [1], and the optical film is disposed in such a manner that, with respect to the plastic film, the surface of the optical film on the UV-absorbing layer side faces the opposite side of the resin plate or the glass plate.

[4] An image display device including a display element and an optical film disposed on the light emitting surface side of the display element, wherein the image display device includes, as the optical film, an optical film X being the optical film according to [1], the optical film X is disposed in such a manner that, with respect to the plastic film, the surface of the optical film X on the UV-absorbing layer side is on the light emitting surface side.

Advantageous Effects of Invention

When being incorporated into an image display device, the optical film and polarizing plate of the present invention can suppress the screen from appearing pale. In addition, the image display device of the present invention can suppress the screen from appearing pale.

DESCRIPTION OF EMBODIMENTS

Hereinafter, embodiments of the present invention will be described.

[Optical Film]

The optical film of the present invention includes a UV-absorbing layer containing a UV-absorbing agent B on a plastic film containing a UV-absorbing agent A, and satisfies the following condition 1;

<Condition 1> the vertical direction with respect to the plane of the optical film is defined as 0 degrees;

the surface of the optical film on the plastic film side is irradiated with excitation light having a wavelength of 365 nm from a direction of +45 degrees using a spectrofluorometer, emitted fluorescence is measured from a direction of −45 degrees, and the sum of intensities of the fluorescence from 380 nm to 490 nm is defined as BL1;

the surface of the optical film on the UV-absorbing layer side is irradiated with excitation light having a wavelength of 365 nm from a direction of +45 degrees using a spectrofluorometer, emitted fluorescence is measured from a direction of −45 degrees, and the sum of intensities of the fluorescence from 380 nm to 490 nm is defined as SL1; and under the foregoing premises, BL1 and SL1 satisfy the following formula (1):

$$SL1/BL1 \leq 0.30 \tag{1}$$

Figure 1:
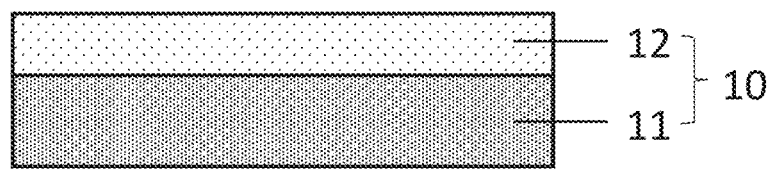
FIG. 1 is a cross-sectional view illustrating an embodiment of the optical film of the present invention.

FIG. 1 is a cross-sectional view illustrating an embodiment of an optical film 10 of the present invention.

The optical film 10 in FIG. 1 includes a UV-absorbing layer 12 containing a UV-absorbing agent B on a plastic film 11 containing a UV-absorbing agent A.

<Condition 1>

First, the technical concept of the condition 1 will be described.

As described above, a plastic film containing a UV-absorbing agent appears pale in some cases because at least either one of the resin component constituting the plastic film and the UV-absorbing agent contained in the plastic film absorbs light in an ultraviolet wavelength region and emits fluorescence in a visible short wavelength region. In addition, thick plastic films tend to cause enhanced intensity of fluorescence emission. Among plastic films, polyester films tend to cause enhanced intensity of fluorescence emission because the resin component polyester tends to emit fluorescence.

Plastic films containing a UV-absorbing agent themselves have resistance to ultraviolet rays, and hence it is not necessary to further form a UV-absorbing layer on such a plastic film. If a high-resolution image display device includes a plastic film containing a UV-absorbing agent kneaded therein, however, the image display device appears pale in some cases when the power is off or when showing a black screen, even when the plastic film does not undergo the occurrence of temporal degradation due to ultraviolet rays. For large-screen image display devices, for example, the left and right edge regions and so on of the screen appear pale in some cases. For image display devices of curved shape (rollable type) or foldable image display devices, a part of the screen appears pale in some cases in various environments, irrespective of the screen size. The above-described "paleness" is inferred to occur because the length of the pathway of sunlight passing through the plastic film is large at a position where light from outside enters at a small angle, and the intensity of fluorescence emission at the position is enhanced. Image display devices including an antireflection layer such as a low-refractive-index layer on the surface have higher sunlight transmittance, and thus a higher tendency to become pale.

According to the optical film of the present invention, by daring to form a UV-absorbing layer containing a UV-absorbing agent B on the plastic film 11 containing a UV-absorbing agent A and having sufficient weatherability, fluorescence emission when sunlight enters from the UV-absorbing layer side is suppressed, and thereby image display devices are suppressed from appearing pale.

Figure 2:
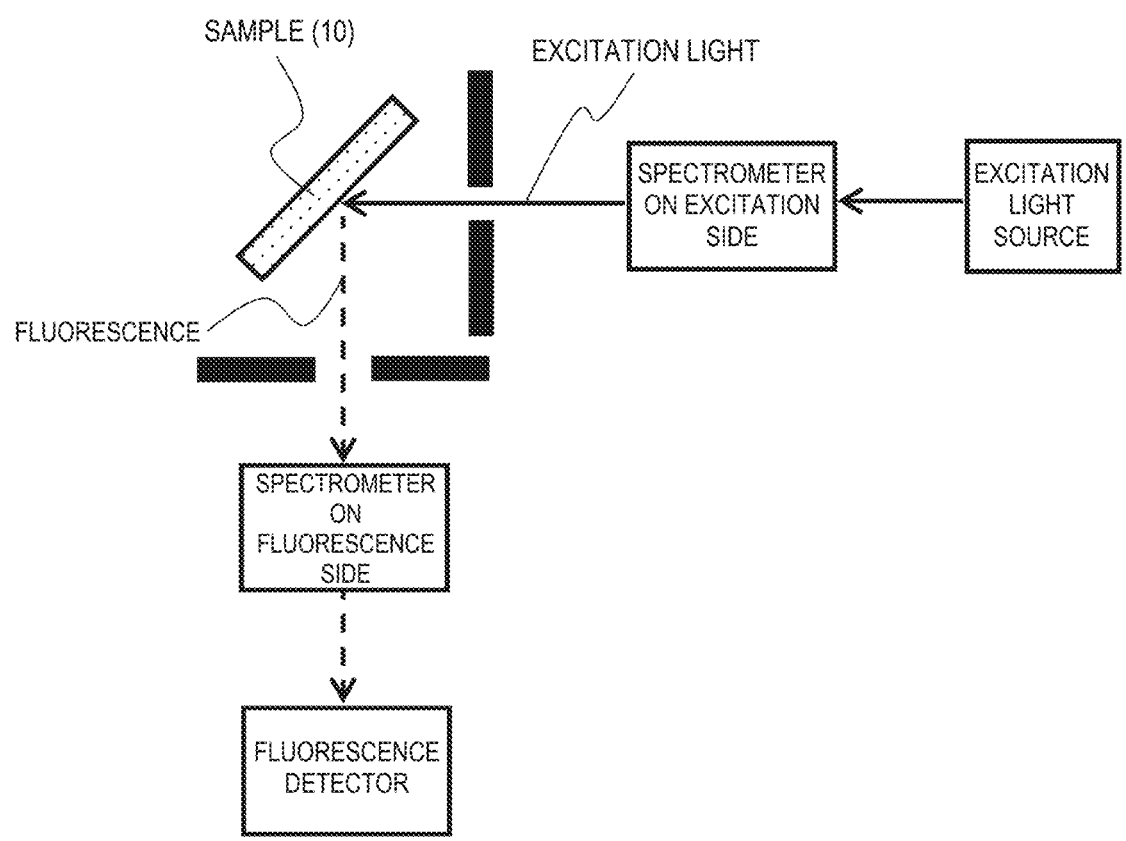
FIG. 2 is a conceptual diagram for measurement of the fluorescence emission of the optical film using a spectrofluorometer.

FIG. 2 is a conceptual diagram for measurement of the fluorescence emitted from the optical film 10 using a spectrofluorometer when the optical film 10 is irradiated with excitation light.

In measurement using a spectrofluorometer in FIG. 2, light from an excitation light source is dispersed into excitation light having a wavelength of 365 nm using a spectrometer on the excitation side. The optical film 10, as a sample, is then irradiated with the excitation light having a wavelength of 365 nm after dispersion from a direction of +45 degrees. Fluorescence emitted from the optical film 10 to a direction of −45 degrees is detected with a fluorescence detector via a spectrometer on the fluorescence side.

Examples of spectrofluorometers applicable to such measurement include the model "F-7000" manufactured by Hitachi High-Tech Science Corporation.

In the formula (1) in the condition 1, "BL1" denotes the sum of intensities of the fluorescence from 380 nm to 490 nm measured from the plastic film 11 side of the optical film, and "SL1" denotes the sum of intensities of the fluorescence from 380 nm to 490 nm measured from the UV-absorbing layer 12 side of the optical film. Thus, small SL1/BL1 in the formula (1) indicates that fluorescence emission on irradiating with excitation light on the UV-absorbing layer side can be suppressed to a higher degree than on the plastic film side.

Accordingly, the optical film having 0.30 or less of SL1/BL1 and satisfying the condition 1 can suppress fluorescence emission on entering of sunlight when being disposed in such a manner that the surface of the UV-absorbing layer side is on the light emitting surface side (the side in which sunlight enters).

SL1/BL1 in the formula (1) is preferably 0.25 or less, and more preferably 0.20 or less. If SL1/BL1 is too small, however, the content of the UV-absorbing agent B in the UV-absorbing layer tends to be high. Hence, it is preferable that SL1/BL1 be 0.10 or more.

<Condition 2>

It is preferable that the optical film of the present invention further satisfy the following condition 2:

<Condition 2> a surface on the plastic film side of the optical film is irradiated with excitation light having a wavelength of 365 nm from a direction of +45 degrees using a spectrofluorometer, emitted fluorescence is measured from a direction of −45 degrees, and the sum of intensities of the fluorescence from 380 nm to 700 nm is defined as BL; and under the foregoing premises, BL and BL1 satisfy the following formula (2):

$$0.50 \leq BL1/BL \quad (2).$$

Large BL1/BL in the formula (2) indicates that the proportion of fluorescence from 380 nm to 490 nm is high in fluorescence emitted on irradiating with excitation light from the plastic film side.

It is preferable to use a substance that does not emit fluorescence for the UV-absorbing agent A in the plastic film; however, in view of the compatibility with the resin constituting the plastic film, thermal resistance (it is preferable for the UV-absorbing agent A to have thermal resistance because the UV-absorbing agent A is kneaded with the resin melted at high temperature when the plastic film is formed), and workability of orientation control in subjecting the plastic film to orientation treatment, it is unavoidable in some cases to use a substance that emits fluorescence for the UV-absorbing agent A. It is also preferable to use a substance that does not emit fluorescence for the resin constituting the plastic film; however, it is unavoidable in some cases to use a substance that emits fluorescence for the resin in order to impart specific physical properties to the plastic film.

The present invention is preferred in that even when the formula (2) is satisfied (even when the UV-absorbing agent A and/or the resin constituting the plastic film are each/is a substance that emits fluorescence), the fluorescence emission of the plastic film containing the UV-absorbing agent A can be suppressed by further including a UV-absorbing layer containing a UV-absorbing agent B.

BL1/BL in the formula (2) is preferably 0.70 or more, and more preferably 0.80 or more. The upper limit of BL1/BL is about 0.95, though the upper limit is not particularly limited thereto.

In measurement using a spectrofluorometer, peaks derived from excitation light tend to appear at wavelengths n-fold (n is an integer) of the wavelength of the excitation light. Herein, the wavelength of excitation light is 365 nm, and a peak derived from the excitation light appears at 730 nm. Accordingly, peaks derived from the excitation light are herein excluded by setting the range for calculation of BL from 380 nm to 700 nm.

<Plastic Film>

The plastic film plays a role as a base material of the optical film, and contains the UV-absorbing agent A.

Examples of the layer configuration of the plastic film include a monolayer structure of a resin layer containing the UV-absorbing agent A (FIG. 1), and a laminated structure of a resin layer containing no UV-absorbing agent and a resin layer containing a UV-absorbing agent (not shown).

Of the mentioned layer configurations, the monolayer structure of a resin layer containing the UV-absorbing agent A is preferred for the plastic film. As described later, it is preferable for good mechanical strength and suppression of rainbow unevenness that the plastic film be an oriented plastic film having a small in-plane retardation. To provide an oriented plastic film with a small in-plane retardation, control to orient generally homogeneously in the vertical direction and horizontal direction is needed. While the mentioned control is difficult in multilayer structures because of the difference of physical properties and so on among layers, the mentioned control is easy in monolayer structures, which are preferred in that it is easy to control the in-plane retardation to a low value.

Examples of the resin component constituting the plastic film include polyester, triacetylcellulose (TAC), cellulose diacetate, cellulose acetate butyrate, polyamide, polyimide, polyethersulfone, polysulfone, polypropylene, polymethylpentene, polyvinyl chloride, polyvinyl acetal, polyether ketone, polymethyl methacrylate, polycarbonate, polyurethane, and amorphous olefin (Cyclo-Olefin-Polymer: COP).

Among them, polyester is preferred in that good mechanical strength is easily obtained. In addition, polyester is preferred in that it emits fluorescence by an ultraviolet ray, and hence the effect of the present invention is effectively exerted with ease. Thus, it is preferable that the plastic film be a polyester film containing the UV-absorbing agent A.

Examples of the polyester constituting the polyester film include polyethylene terephthalate (PET), polyethylene naphthalate (PEN), and polybutylene terephthalate (PBT). Among them, PET is preferred in that it is easy to control the in-plane retardation to a low value because of the low intrinsic birefringence, and that it is easy to reduce the absolute amount of fluorescence emission.

<<Oriented Plastic Film>>

To obtain good mechanical strength, the plastic film is preferably an oriented plastic film, and more preferably an oriented polyester film. Further, the oriented polyester film preferably has a monolayer structure of a resin layer containing the UV-absorbing agent A, and more preferably has a monolayer structure of a polyester resin layer containing the UV-absorbing agent A.

The oriented plastic film can be obtained by orienting a resin layer containing a UV-absorbing agent. Examples of orienting methods include biaxial orienting such as successive biaxial orienting and simultaneous biaxial orienting and uniaxial orienting such as longitudinal uniaxial orienting. Among them, biaxial orienting is preferred because it is easy to obtain a low in-plane retardation and a high mechanical strength. Thus, it is preferable that the oriented plastic film be a biaxially oriented plastic film. Among biaxially oriented plastic films, biaxially oriented polyester films are preferred.

[Successive Biaxial Orienting]

In successive biaxial orienting, a casting film is oriented in the longitudinal direction, and the film is then oriented in the transverse direction.

Orientation in the longitudinal direction is typically achieved by rotational speed difference between rolls, and may be carried out in one step, or carried out in multiple steps using a plurality of roll pairs. The orientation ratio in the longitudinal direction is typically 2 to 15 times, and, from the viewpoint of reducing unevenness of optical properties such as in-plane retardation, preferably 2 to 7 times, more preferably 3 to 5 times, and still more preferably 3 to 4 times.

From the viewpoint of reducing unevenness of optical properties such as in-plane retardation, it is preferable that the orientation temperature be from the glass transition temperature of the resin to the glass transition temperature+100° C. For PET, the orientation temperature is preferably 70 to 120° C., more preferably 80 to 110° C., and still more preferably 95 to 110° C.

Functions such as slidability, adhesiveness, and antistatic properties may be imparted to the film oriented in the longitudinal direction through in-line coating. As necessary, surface treatment such as corona treatment, flame treatment, and plasma treatment may be applied before in-line coating.

A coating film formed in such in-line coating has a thickness as small as about 10 nm to 2000 nm (the coating film is further stretched through orientation treatment). Herein, such a thin layer is not counted as a layer constituting the plastic film. For example, the plastic film in which the above-described very thin layer is laminated on the resin layer containing the UV-absorbing agent A is interpreted as having a monolayer structure of the resin layer containing the UV-absorbing agent A.

For orientation in the transverse direction, a tenter method is used, wherein a film is oriented in the transverse direction while being conveyed with both ends of the film held with clips. The orientation ratio in the transverse direction is typically 2 to 15 times, and, from the viewpoint of reducing unevenness of optical properties such as in-plane retardation, preferably 2 to 5 times, more preferably 3 to 5 times, and still more preferably 3 to 4.5 times. It is preferable that the transverse orientation ratio is higher than the longitudinal orientation ratio.

It is preferable for the orientation temperature to be from the glass transition temperature of the resin to the glass transition temperature+120° C., and it is preferable that the temperature increase occurs from the upstream to the downstream. Specifically, as the section for transverse orientation is bisected, the difference between the temperature in the upstream and the temperature in the downstream is preferably 20° C. or more, more preferably 30° C. or more, still more preferably 35° C. or more, and even still more preferably 40° C. or more. For PET, the orientation temperature in the first step is preferably 80 to 120° C., more preferably 90 to 110° C., and still more preferably 95 to 105° C.

In order to impart flatness and dimensional stability, it is preferable to perform heat treatment for the plastic film subjected to successive biaxial orienting as above in a tenter at the orientation temperature or higher and the melting point or lower. Specifically, heat fixation is performed preferably in the range from 120 to 235° C., more preferably in the range from 190 to 225° C. From the viewpoint of reducing unevenness of optical properties such as in-plane retardation, it is preferable to perform additional heat-treating orientation at 1 to 10% in the former half of the heat treatment.

After being subjected to the heat treatment, the plastic film is slowly cooled to room temperature and then wound. As necessary, relaxation treatment and so on may be used in combination in the heat treatment or slow cooling. The relaxation rate in the heat treatment is, from the viewpoint of reducing unevenness of optical properties such as in-plane retardation, preferably 0.5 to 5%, more preferably 0.5 to 3%, still more preferably 0.8 to 2.5%, and even still more preferably 1 to 2%. The relaxation rate in the slow cooling is, from the viewpoint of reducing unevenness of optical properties such as in-plane retardation, preferably 0.5 to 3%, more preferably 0.5 to 2%, still more preferably 0.5 to 1.5%, and even still more preferably 0.5 to 1.0%. The temperature in the slow cooling is, from the viewpoint of flatness, preferably 80 to 150° C., more preferably 90 to 130° C., still more preferably 100 to 130° C., and even still more preferably 100 to 120° C.

[Simultaneous Biaxial Orienting]

In simultaneous biaxial orienting, a casting film is introduced into a simultaneous biaxial tenter, conveyed with both ends of the film held with clips, and oriented simultaneously and/or stepwise in the longitudinal direction and transverse direction. While there are simultaneous biaxial orienting machines of pantograph type, screw type, drive motor type, and linear motor type, those of drive motor type or linear motor type allow arbitrary change of the orientation ratio and relaxation treatment at any place, and are thus preferred.

The ratio of simultaneous biaxial orienting is typically 6 to 50 times in an area ratio, and, from the viewpoint of reducing unevenness of optical properties such as in-plane retardation, preferably 8 to 30 times, more preferably 9 to 25 times, still more preferably 9 to 20 times, and even still more preferably 10 to 15 times.

In simultaneous biaxial orienting, it is preferable for reduction of in-plane orientation difference to set the orientation ratio in the longitudinal direction and that in the transverse direction to be identical to each other and set the orientation speeds in those directions to be almost identical to each other.

The orientation temperature in simultaneous biaxial orienting is, from the viewpoint of reducing unevenness of optical properties such as in-plane retardation, preferably from the glass transition temperature of the resin to the glass transition temperature+120° C. For PET, the orientation temperature is preferably 80 to 160° C., more preferably 90 to 150° C., and still more preferably 100 to 140° C.

In order to impart flatness and dimensional stability, it is preferable to perform heat treatment for the film subjected to simultaneous biaxial orienting subsequently in a heat fixation chamber in the tenter at the orientation temperature or higher and the melting point or lower. The conditions for the heat treatment are the same as the conditions for the heat treatment after successive biaxial orienting.

<<UV-Absorbing Agent A>>

For the UV-absorbing agent A contained in the plastic film, one or two or more of general-purpose organic UV-absorbing agents including benzotriazole-based UV-absorbing agents, triazine-based UV-absorbing agents, benzoxazinone-based UV-absorbing agents, benzophenone-based UV-absorbing agents, and anthracene-based UV-absorbing agents can be used in such a manner that the effect of the present invention is not inhibited. It is preferable that the maximum absorption wavelength of the UV-absorbing agent A be 200 nm to 360 nm.

Ideally, the UV-absorbing agent A preferably exhibits a low intensity of fluorescence emission from 380 nm to 490 nm. However, some types of UV-absorbing agents are poorly compatible with the resin constituting the plastic film and others complicate control of orientation. Even if the UV-absorbing agent A is a substance that emits fluorescence, the fluorescence emission of the UV-absorbing agent A can be suppressed with a UV-absorbing layer described later.

Accordingly, it is preferable to select a substance, as the UV-absorbing agent A, that is superior in compatibility with resins and makes it easy to control orientation. In the case that the resin constituting the plastic film is polyester such as PET, for example, benzoxazinone-based UV-absorbing agents and anthracene-based UV-absorbing agents are preferred and benzoxazinone-based UV-absorbing agents are more preferred as the UV-absorbing agent A. Although benzoxazinone-based UV-absorbing agents and anthracene-based UV-absorbing agents exhibit relatively high intensity of fluorescence emission from 380 nm to 490 nm, the fluorescence emission of a benzoxazinone-based UV-absorbing agent or anthracene-based UV-absorbing agent as the UV-absorbing agent A can be suppressed with a UV-absorbing layer described later to make satisfaction of the condition 1 easy.

Examples of benzoxazinone-based UV-absorbing agents preferred in the case that the resin constituting the plastic film is polyester such as PET include 2,2'-p-phenylenebis(4H-3,1-benzoxazin-4-one), 2,2'-p-phenylenebis(6-methyl-4H-3,1-benzoxazin-4-one), 2,2'-p-phenylenebis(6-chloro-4H-3,1-benzoxazin-4-one), 2,2'-p-phenylenebis(6-methoxy-4H-3,1-benzoxazin-4-one), 2,2'-p-phenylenebis(6-hydroxy-4H-3,1-benzoxazin-4-one), 2,2'-(naphthalene-2,6-diyl)bis(4H-3,1-benzoxazin-4-one), 2,2'-(naphthalene-1,4-diyl)bis(4H-3,1-benzoxazin-4-one), 2,2'-(thiophene-2,5-diyl)bis(4H-3,1-benzoxazin-4-one), 2,2'-(furan-2,5-diyl)bis(4H-3,1-benzoxazin-4-one), and 2,2'-(pyrrole-2,5-diyl)bis(4H-3,1-benzoxazin-4-one).

Measurement of the maximum absorption wavelength of UV-absorbing agents is described, for example, in "The Fourth Series of Experimental Chemistry 7—Spectrometry II" (Maruzen Publishing Co., Ltd., 1992), ed. The Chemical Society of Japan, pp. 180-186. Specifically, a sample, which has been dissolved in an appropriate solvent, can be subjected to measurement with a spectrophotometer using two cells made of quartz or glass, one for the sample and the other for a control. The solvent to be used is required not only to have capability of dissolving the sample but also to exhibit no absorption in the measurement wavelength region, to exhibit small interaction with the solute molecules, to have not-so-significant volatility, and so on. Any solvent that satisfies the mentioned conditions can be selected.

It is preferable to add the UV-absorbing agent A in such an amount that the spectral transmittance of the optical film at a wavelength of 380 nm can be controlled in a range described later. It should be noted that if the UV-absorbing agent A is added excessively, the UV-absorbing agent A tends to bleed out of the plastic film.

Therefore, the content of the UV-absorbing agent in the resin layer containing the UV-absorbing agent A is preferably 0.01 to 5 parts by mass and more preferably 0.05 to 2 parts by mass with respect to 100 parts by mass of the resin component.

The plastic film may contain an additive such as an antistatic agent, a flame retardant, a thermal stabilizer, an antioxidant, an anti-gelling agent, and a surfactant in such a manner that the effect of the present invention is not inhibited. Since plastic films often have high smoothness, the plastic film may contain organic fine particles or inorganic fine particles to prevent blocking.

<Physical Properties of Plastic Film>

The thickness, T, of the plastic film is preferably 15 to 150 μm, more preferably 15 to 60 μm, still more preferably 20 to 55 μm, and even still more preferably 30 to 50 μm.

Setting the thickness, T, to 15 μm or larger allows the plastic film to have good mechanical strength with ease.

Setting the thickness, T, to 150 μm or smaller can suppress the optical film from being thick. Setting the thickness, T, to 60 μm or smaller can make satisfaction of the condition 1 easy and make it easy to control the in-plane retardation in a range described later.

If the thickness, T, is too large, the paleness of the image display device is easily recognized even when the condition 1 is satisfied. Also from this viewpoint, the thickness, T, is preferably 60 μm or smaller.

It is preferable to change the thickness, T, of the plastic film according to the application.

If the plastic film is applied to an image display device of curved shape or foldable image display device, for example, the thickness, T, is, from the viewpoint of folding resistance, preferably 15 to 100 μm, more preferably 17 to 65 μm, still more preferably 18 to 60 μm, and even still more preferably 20 to 45 μm. From the viewpoint of better folding resistance, it is preferable that the thickness, T, satisfy the previous described range and the in-plane retardation (Re) be 1400 nm or less. If the in-plane retardation (Re) is even 1000 nm or less, 850 nm or less, or 500 nm or less, much better folding resistance is achieved.

If the plastic film is applied to a flat, large-screen image display device (maximum dimension: 1300 mm or larger), the thickness, T, is preferably 20 to 150 μm, more preferably 15 to 85 µm, still more preferably 27 to 70 µm, and even still more preferably 30 to 55 µm.

If the plastic film is applied to a flat image display device (maximum dimension: smaller than 1300 mm), the thickness, T, is preferably 15 to 130 µm, more preferably 15 to 70 µm, still more preferably 20 to 60 µm, and even still more preferably 25 to 50 µm.

The in-plane retardation (Re) of the plastic film is preferably 500 nm or less, more preferably 400 nm or less, still more preferably 300 nm or less, and even still more preferably 250 nm or less. Setting the in-plane retardation to 500 nm or less makes it easy to suppress rainbow unevenness (principally, rainbow unevenness in unaided visual observation). If the plastic film has an in-plane retardation (Re) of 500 nm or less, the plastic film tends to be capable of providing good folding resistance because of the low degree of alignment, and is thus preferred in that the plastic film is readily applicable to image display devices of curved shape and foldable image display devices. The lower limit of the in-plane retardation is typically about 50 nm, though the lower limit is not particularly limited thereto.

In the case that the optical film includes an antireflection layer on the UV-absorbing layer, rainbow unevenness (principally, rainbow unevenness in unaided visual observation) can be suppressed with ease, even if the in-plane retardation (Re) of the plastic film is more than 500 nm. Accordingly, in the case that the optical film includes an antireflection layer on the UV-absorbing layer, the in-plane retardation (Re) of the plastic film is preferably 1400 nm or less, more preferably 1200 nm or less, more preferably 1000 nm or less, more preferably 500 nm or less, more preferably 300 nm or less, and more preferably 250 nm or less. The lower limit of the in-plane retardation (Re) of the plastic film in the case that the optical film includes an antireflection layer on the UV-absorbing layer is not limited from the viewpoint of suppression of rainbow unevenness; however, the effect to suppress rainbow unevenness is saturated if the in-plane retardation is excessively decreased. If the in-plane retardation (Re) of the plastic film is increased, the plastic film tends to have higher mechanical strength. Accordingly, the lower limit of the in-plane retardation (Re) of the plastic film in the case that the optical film includes an antireflection layer on the UV-absorbing layer is preferably 100 nm or more.

It can become easier to control the in-plane retardation (Re) to 500 nm or less by decreasing (nx−ny) in a formula (A) described later or by decreasing the thickness, T. In order to decrease (nx−ny), it is preferable to carry out orientation in the longitudinal direction and transverse direction as described above.

Herein, in-plane retardation (Re) and retardation in the thickness direction (Rth) described later are values of them at a wavelength of 550 nm.

The ratio between the in-plane retardation (Re) and the retardation in the thickness direction (Rth), [Re/Rth], in the plastic film is preferably 0.25 or less, more preferably 0.20 or less, more preferably 0.16 or less, more preferably 0.13 or less, more preferably 0.10 or less, more preferably 0.09 or less, and more preferably 0.08 or less.

As the ratio becomes smaller, the degree of orientation of the plastic film approaches even biaxial one. Therefore, good mechanical strength can be imparted to the plastic film by setting the ratio to 0.20 or less (preferably 0.10 or less).

The in-plane retardation (Re) and the retardation in the thickness direction (Rth) are represented by formulas (A) and (B) below using nx as the refractive index in the slow axis direction, which is a direction with the largest refractive index in the plane of the plastic film, ny as the refractive index in the fast axis direction, which is the direction orthogonal to the slow axis direction in the plane, nz as the refractive index of the plastic film in the thickness direction, and T [nm] as the thickness of the plastic film.

The in-plane retardation (Re) and the retardation in the thickness direction (Rth) can be measured, for example, using "RETS-100", a product name, manufactured by Otsuka Electronics Co., Ltd., or "KOBRA-WR" or "PAM-UHR100", product names, manufactured by Oji Scientific Instruments.

$$\text{In-plane retardation } (Re)=(nx-ny)\times T[\text{nm}] \quad \text{(A)}$$

$$\text{Retardation in thickness direction } (Rth)=((nx+ny)/2-nz)\times T[\text{nm}] \quad \text{(B)}$$

When the in-plane retardation (Re) and so on are measured using "RETS-100", a product name, manufactured by Otsuka Electronics Co., Ltd., it is preferable to prepare measurement according to the following procedures (A1) to (A4).

(A1) First, to stabilize the light source of RETS-100, the light source is turned on and then left to stand for 60 minutes or longer. Thereafter, a rotating-analyzer method is selected together with a θ mode (a mode of retardation measurement in the angle direction and Rth calculation). As a result of selecting the θ mode, the stage functions as a tilted, rotating stage.

(A2) Subsequently, the following measurement conditions are inputted to RETS-100.

<Measurement Conditions>

Retardation measurement range: rotating-analyzer method

Measurement spot diameter: ϕ5 mm

Tilt angle range: −40 degrees to +40 degrees, at intervals of 10 degrees (in measurement of Re, select 0 degrees)

Measurement wavelength range: 400 nm to 800 nm

Average refractive index of plastic film (e.g., for PET film, set N=1.617)

Thickness: measured value of thickness (input thickness separately measured by SEM or optical microscope.)

(A3) Subsequently, background data are acquired with no sample set in the apparatus. With applying a closed system to the apparatus, this operation is carried out every time the light source is turned on.

(A4) Thereafter, a sample is set on the stage in the apparatus, and subjected to measurement. The in-plane retardation (Re) and retardation in the thickness direction (Rth) in the plastic film can be measured even when another layer such as the UV-absorbing layer is present on the plastic film. If another layer is present on the plastic film, it is preferable to carry out measurement with allowing the surface having the higher flatness to face the stage.

It is preferable that the plastic film be a polyester film and the surface alignment ratio shown below be more than 1.0 and 3.0 or less, more preferably 1.0 or more and 2.0 or less, still more preferably 1.0 or more and 1.50 or less, and even still more preferably 1.0 or more and 1.3 or less.

[Surface Alignment Ratio]

The slow axis direction, which is a direction with the highest refractive index in a plane of a measurement region of the plastic film, is regarded as the reference (0 degrees), and the plastic film is subjected to measurement using an FTIR-S polarized ATR method while being rotated within the range of 0 degrees to 170 degrees, and the absorption intensity at 1340 cm$^{-1}$ ($I_{1340}$) and absorption intensity at 1410 cm$^{-1}$ ($I_{1410}$) in the single reflection spectrum for the plastic film are determined at intervals of 10 degrees. $I_{1340}/I_{1410}$ is defined as an alignment parameter, Y, at each angle. The maximum value and minimum value among the 18 alignment parameters, Y, thus determined are defined as $Y_{max}$ and $Y_{min}$, respectively, and $Y_{max}/Y_{min}$ is defined as the surface alignment ratio of the plastic film.

Setting the surface alignment ratio to more than 1.0 allows a polyester film as the plastic film to have good mechanical strength with ease. Setting the surface alignment ratio to 3.0 or less makes it easy to control the in-plane retardation of a polyester film as the plastic film in the above-described range.

The surface alignment ratio can be measured, for example, using an FT-IR measurement apparatus (product name: NICOLET6700, measurement spot: 2 mm in diameter), manufactured by Thermo Fisher Scientific, equipped with an ATR device (product name: Seagull) and a polarizer (product name: KRS-5, wire grids), each manufactured by Harrick Scientific Products Inc., with the measurement surface of the plastic film set in the ATR device, through infrared absorption spectrum analysis of single reflection in an FTIR-S polarized ATR method. Detailed measurement conditions for measurement of the surface alignment ratio using the equipment are as shown below.

An absorption band at 1340 cm$^{-1}$ indicates ω CH$_2$ vertical vibration and the presence of a trans form, and the intensity indicates the concentration of the trans form, that is, quantitatively indicates a highly oriented state with elongated polyester molecules. An absorption band at 1410 cm$^{-1}$ indicates, on the other hand, C=C stretching vibration, and is used as a reference band for normalization of absorption intensities to achieve a constant absorption intensity in in-plane rotation.

<Measurement Conditions>
 Light source: infrared light
 Detector: TGS detector
 Resolution: 4 cm$^{-1}$
 Measurement area: approximately 1.2 mm ϕ
 Method: macro-ATR measurement
 Measurement region: 4000 to 700 cm$^{-1}$
 Crystal used: Ge, measurement depth area: approximately 1 μm
 Refractive index (in ATR measurement): 4.0
 Angle of incidence on sample (in ATR measurement): 45 degrees The haze of the plastic film as defined in JIS K7136: 2000 is preferably 3.0% or less, more preferably 2.0% or less, and still more preferably 1.0% or less.

The total light transmittance of the plastic film as defined in JIS K7361-1: 1997 is preferably 80% or more, more preferably 85% or more, and still more preferably 90% or more.

Herein, the in-plane retardation (Re), retardation in the thickness direction (Rth), surface alignment ratio, haze, and total light transmittance are each a mean value of measurements at 16 positions. In a measurement sample, a region of 1 cm in width from the outer periphery is excluded as a margin, lines that evenly divide the remaining region into five portions are drawn in the vertical direction and then in the horizontal direction, and the resulting intersects are preferably used as the centers of measurement, that is, as the 16 measurement positions. In the case that the shape of a measurement sample is a rectangle, a region of 1 cm in width from the outer periphery of the rectangle is excluded as a margin, measurement is performed at 16 intersects, as the centers of measurement, formed by drawing lines that evenly divide the remaining region into five portions in the vertical direction and then in the horizontal direction, and the mean value is preferably calculated. In the case that the shape of a measurement sample is a non-rectangular shape such as a circle, an ellipse, a triangle, and a pentagon, a rectangle that is inscribed in the shape with the maximum area is drawn, and measurement is preferably performed at 16 positions in the rectangle according to the mentioned method. Measurement regions may partially overlap in some cases depending on the relationship between the size of a measurement sample and the size of each measurement spot, and, in such cases, measurement can be performed in a duplicate manner.

Among measurements at 16 positions acquired as described above, the variation of Re is preferably within ±100 nm, and more preferably within ±50 nm to the mean value. The variation of Rth is preferably within ±200 nm, and more preferably within ±100 nm to the mean value. The variation of each of haze and total light transmittance is preferably within ±15%, and more preferably within ±10% to the mean value.

<Folding Resistance>

It is preferable for the plastic film not to undergo the occurrence of cracking or break after being subjected to 100000 cycles (more preferably, after being subjected to 300000 cycles) of a folding test described below. It is more preferable for the plastic film that when a measurement sample thereof after being subjected to 100000 cycles (more preferably, after being subjected to 300000 cycles) of a folding test described below is placed on a horizontal table, the angle of edge warpage of the measurement sample from the table be 15 degrees or smaller. If the angle of edge warpage of the sample is 15 degrees or smaller, this means being resistant to creasing due to folding. If the plastic film has a slow axis and a fast axis, it is preferable for the plastic film to exhibit the above-described result (no occurrence of cracking, breaking, or creasing due to folding) in any of the directions.

Similarly, it is preferable for the optical film of the present invention, which includes a UV-absorbing layer on the plastic film, to have the folding resistance as described above. In this case, it is preferable for the optical film to have such folding resistance that the optical film endures 100000 cycles or even 300000 cycles or more of folding both for the case of folding with the UV-absorbing layer being inside and for the case of folding with the UV-absorbing layer being outside.

<<Folding Test>>

A strip-shaped sample of 30 mm in the short side×100 mm in the long side is cut out of the plastic film. The sample is fixed to a durability tester (product name: "DLDMLH-FS", manufactured by YUASA SYSTEM Co., Ltd.) at both ends (regions within 10 mm from each tip are fixed) in the short side (30 mm), and a repeated folding test involving 180-degrees folding is carried out in 100000 cycles (or 300000 cycles). The folding frequency is 120 cycles per minute. More detailed procedures of the folding test are as follows.

A strip-shaped sample after the folding test is placed on a horizontal table, and the angle of edge warpage of the sample from the table is measured. A sample that underwent the occurrence of cracking or breaking during the test is regarded as "cracked" or "broken".

If the plastic film has a slow axis and a fast axis, two types of samples, a sample with the short side being the slow axis and a sample with the short side being the fast axis, are prepared, and the two types of samples are tested.

<<<Details of Folding Test>>

Figure 8:
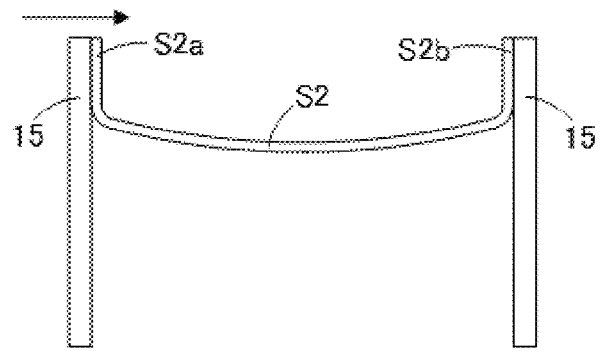
FIGS. 8 (A), (B), and (C) schematically illustrate the procedure of repeated folding test.
Figure 8:
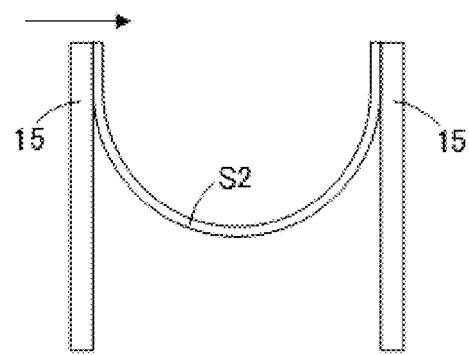
Figure 8:
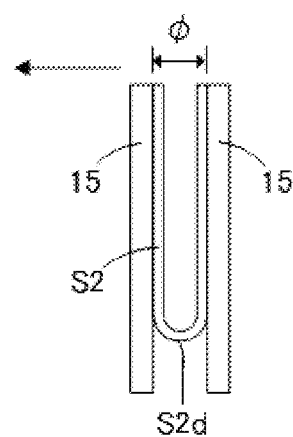

In the repeated folding test, as illustrated in FIG. 8(A), a side part S2a of a sample S2 and a side part S2b facing the side part S2a are fixed with fixing parts 15 disposed in parallel. The fixing parts 15 are slidable in the horizontal direction.

Next, as illustrated in FIG. 8(B), the fixing parts 15 are moved to bring close to each other, thereby deforming the sample S2 like folding. Further, as illustrated in FIG. 8(C), the fixing parts 15 are moved until the interval, φ, between the two side parts of the sample S2 that are facing each other and fixed with the fixing parts 15 reaches, for example, 7 mm, and thereafter the fixing parts 15 are moved in the reverse direction to relieve the deformation of the sample S2.

The sample S2 can be folded at 180 degrees by moving the fixing parts 15 as illustrated FIG. 8(A) to (C). The interval between the two side parts of the sample S2 that are facing each other can be set to 7 mm by carrying out the repeated folding test in such a manner that the bending part S2d of the sample S2 does not protrude out of the lowest level of the fixing parts 15 while the interval when the fixing parts 15 come closest is controlled to 7 mm.

It is preferable that cracking, breaking, or creasing due to folding as mentioned above be not caused as a result of 100000 cycles or 300000 cycles of the test with such an interval, φ. It is the most preferable that good results be provided even for an interval, φ, as small as any of 5 mm, 3 mm, 2 mm, and 1 mm. Such folding resistance satisfactorily allows use for foldable image display devices, rollable image display devices, and image display devices with various designs.

<UV-Absorbing Layer>

The optical film of the present invention includes a UV-absorbing layer containing a UV-absorbing agent B on the plastic film.

By daring to form a UV-absorbing layer containing a UV-absorbing agent B on the plastic film containing a UV-absorbing agent A, as described above, the optical film of the present invention can suppress fluorescence emission when sunlight enters from the UV-absorbing layer side, and thereby suppress image display devices from appearing pale.

If a UV-absorbing agent is contained only in a single layer, it is needed for setting the UV transmittance of the whole optical film to a predetermined value or less to allow the single layer to contain a large amount of a UV-absorbing agent, which causes a problem of bleeding-out of the UV-absorbing agent. By contrast, since a UV-absorbing agent is contained in two layers (the plastic film and the UV-absorbing layer) in the optical film of the present invention, the contents of the UV-absorbing agent in these two layers can be reduced, and thus the optical film of the present invention is preferred in that the problem of bleeding-out of the UV-absorbing agent can be suppressed.

<<UV-Absorbing Agent B>>

The UV-absorbing agent B is preferably an organic UV-absorbing agent having a maximum absorption wavelength of 200 to 360 nm. To satisfy the condition 1 with ease, the UV-absorbing agent B is preferably a substance that emits little fluorescence from 380 nm to 490 nm on absorbing light in an ultraviolet region.

One or more selected from the group consisting of benzotriazole-based UV-absorbing agents, triazine-based UV-absorbing agents, benzophenone-based UV-absorbing agents, and malonate-based UV-absorbing agents are preferred as the UV-absorbing agent B. Among them, one or more selected from the group consisting of substances having two or less intramolecular aromatic rings are more preferred. Benzoxazine-based UV-absorbing agents and anthracene-based UV-absorbing agents tend to readily emit fluorescence from 380 nm to 490 nm on absorbing light in an ultraviolet region.

It is preferable to use two or more UV-absorbing agents as the UV-absorbing agent B. The combination of two or more UV-absorbing agents is preferably (i) or (ii) below. In the case of (i) below, two or more may be selected only from benzotriazole-based UV-absorbing agents, and two or more may be selected only from triazine-based UV-absorbing agents.

(i) A combination of two or more selected from the group consisting of benzotriazole-based UV-absorbing agents and triazine-based UV-absorbing agents.

(ii) A combination of one or more selected from the group consisting of benzotriazole-based UV-absorbing agents and triazine-based UV-absorbing agents and one or more selected from the group consisting of benzophenone-based UV-absorbing agents, malonate-based UV-absorbing agents, anilide oxalate-based UV-absorbing agents, and indole-based UV-absorbing agents.

It is preferable for the UV-absorbing agent B to satisfy the following condition 3-1. In the case that a plurality of UV-absorbing agents is contained as the UV-absorbing agent B, it is sufficient that any one of the UV-absorbing agents satisfies the following condition 3-1; however, it is more preferable that all the UV-absorbing agents satisfy the following condition 3-1.

<Condition 3-1>

The absorbance of the UV-absorbing agent B in a wavelength region of 250 nm to 450 nm is measured at intervals of 1 nm, and the absorbance at the maximum absorption wavelength, $I_B$ (nm), is defined as X; the shortest wavelength at which the absorbance is 0.8× or less in a wavelength region longer than the wavelength, $I_B$, is defined as +Y (nm), and the shortest wavelength at which the absorbance is 0.8× or less in a wavelength region shorter than the wavelength, $I_B$, is defined as −Y (nm); and as the maximum absorption wavelength of the UV-absorbing agent A is defined as $I_A$ (nm), the following formula (3) is further satisfied:

$$-Y \leq I_A \leq +Y \qquad (3).$$

In addition, it is preferable for the UV-absorbing agent B to satisfy the following condition 3-2. In the case that a plurality of UV-absorbing agents is contained as the UV-absorbing agent B, it is sufficient that any one of the UV-absorbing agents satisfies the following condition 3-2; however, it is more preferable that all the UV-absorbing agents satisfy the following condition 3-2.

<Condition 3-2>

As the absorption center wavelength of the resin constituting the plastic film is defined as $I_C$ (nm), the +Y (nm), −Y (nm), and $I_C$ (nm) satisfy the following formula (4):

$$-Y \leq I_C \leq +Y \qquad (4).$$

The absorption center wavelength of the resin constituting the plastic film can be calculated as in (A1) and (A2) below. The absorption center wavelength of PET is approximately 320 nm.

(A1) The spectral transmittance of the resin is measured, and the average of spectral transmittance in 450 nm to 500 nm is defined as T (%).

(A2) Among wavelengths at which the spectral transmittance is T/2(%) or less, the longest wavelength is defined as the absorption center wavelength, $I_C$ (nm).

Satisfying the condition 3-1 and/or the condition 3-2 can make it easy to suppress the fluorescence emission of the plastic film containing the UV-absorbing agent A with the UV-absorbing layer.

It is preferable to satisfy both of the condition 3-1 and the condition 3-2.

It is preferable to add the UV-absorbing agent B in such an amount that the spectral transmittance of the optical film at a wavelength of 380 nm can be controlled in a range described later. It should be noted that if the UV-absorbing agent B is added excessively, the UV-absorbing agent B tends to bleed out of the UV-absorbing layer.

Therefore, the content of the UV-absorbing agent B in the UV-absorbing layer is preferably 0.1 to 20 parts by mass and more preferably 1 to 10 parts by mass with respect to 100 parts by mass of a binder resin. In the case that a plurality of UV-absorbing agents is contained as the UV-absorbing agent B, it is preferable that the total amount of the plurality of UV-absorbing agents be in the range.

<<Binder Resin>>

It is preferable for the UV-absorbing layer to contain a binder resin.

Examples of the binder resin include thermoplastic resins, cured products of curable resin compositions, and mixtures of them. Among them, cured products of curable resin compositions are preferred from the viewpoint of scratch resistance. Examples of curable resin compositions include thermosetting resin compositions and ionizing radiation-curable resin compositions, and ionizing radiation-curable resin compositions are preferred from the viewpoint of scratch resistance. That is, it is the optimum to contain a cured product of an ionizing radiation-curable resin composition as the binder resin.

Thermosetting resin compositions are compositions at least containing a thermosetting resin, and are resin compositions that cure by heating.

Examples of thermosetting resins include acrylic resins, urethane resins, phenolic resins, urea-melamine resins, epoxy resins, unsaturated polyester resins, and silicone resins. For a thermosetting resin composition, a curing agent is added to such a curable resin, as necessary.

Ionizing radiation-curable resin compositions are compositions containing a compound having an ionizing radiation-curable functional group (hereinafter, also referred to as "ionizing radiation-curable compound"). Examples of ionizing radiation-curable functional groups include ethylenic unsaturated bond groups such as a (meth)acryloyl group, a vinyl group, and an allyl group, an epoxy group, and an oxetanyl group.

Compounds having an ethylenic unsaturated bond group are preferred as ionizing radiation-curable resins, and compounds having two or more ethylenic unsaturated bond groups are more preferred. Among them, polyfunctional (meth)acrylate-based compounds having two or more ethylenic unsaturated bond groups are still more preferred. Polyfunctional (meth)acrylate-based compounds in any of a monomer and an oligomer can be used.

Ionizing radiation refers to an electromagnetic wave or charged particle beam having an energy quantum that can cause molecules to polymerize or crosslink, and an ultraviolet ray (UV) or an electron beam (EB) is typically used therefor; however, other electromagnetic waves such as X-rays and γ-rays and other charged particle beams such as α-rays and ion beams are also applicable.

Examples of bifunctional (meth)acrylate-based monomers among polyfunctional (meth)acrylate-based compounds include ethylene glycol di(meth)acrylate, bisphenol A tetraethoxy diacrylate, bisphenol A tetrapropoxy diacrylate, and 1,6-hexanediol diacrylate.

Examples of tri- or higher functional (meth)acrylate-based monomers include trimethylolpropane tri(meth)acrylate, pentaerythritol tri(meth)acrylate, pentaerythritol tetra(meth)acrylate, dipentaerythritol hexa(meth)acrylate, dipentaerythritol tetra(meth)acrylate, and isocyanuric acid-modified tri(meth)acrylate.

The (meth)acrylate-based monomers may be those with the molecular framework partially modified, and those modified, for example, with ethylene oxide, propylene oxide, caprolactone, isocyanuric acid, an alkyl, a cyclic alkyl, an aromatic, or bisphenol can also be used.

Examples of polyfunctional (meth)acrylate-based oligomers include acrylate-based polymers such as urethane (meth)acrylate, epoxy (meth)acrylate, polyester (meth)acrylate, and polyether (meth)acrylate.

Urethane (meth)acrylate can be obtained, for example, by reaction of a polyhydric alcohol and organic diisocyanate with hydroxy (meth)acrylate.

Preferred epoxy (meth)acrylates are (meth)acrylates obtained by reaction of a tri- or higher functional aromatic epoxy resin, alicyclic epoxy resin, aliphatic epoxy resin, or the like and (meth)acrylic acid; (meth)acrylates obtained by reaction of a bi- or higher functional aromatic epoxy resin, alicyclic epoxy resin, aliphatic epoxy resin, or the like, a polybasic acid, and (meth)acrylic acid; and (meth)acrylates obtained by reaction of a bi- or higher functional aromatic epoxy resin, alicyclic epoxy resin, aliphatic epoxy resin, or the like, a phenol, and (meth)acrylic acid.

One of the ionizing radiation-curable resins can be used singly, and two or more thereof can be used in combination.

In the case that the ionizing radiation-curable resin is a UV-curable resin, it is preferable for the coating solution for formation of the UV-absorbing layer to contain an additive such as a photopolymerization initiator and a photopolymerization promotor.

Examples of the photopolymerization initiator include one or more selected from the group consisting of acetophenone, benzophenone, α-hydroxyalkylphenone, Michler ketone, benzoin, benzyl dimethyl ketal, benzoyl benzoate, α-acyloxime ester, α-aminoalkylphenone, thioxanthones, and so on.

The photopolymerization promotor is a substance that can mitigate polymerization inhibition due to air to increase the curing rate in curing, and examples thereof include one or more selected from the group consisting of isoamyl p-dimethylaminobenzoate, ethyl p-dimethylaminobenzoate, and so on.

<<Particles>>

The UV-absorbing layer may contain particles. Anti-glare properties can be imparted to the optical film by the UV-absorbing layer containing particles.

Any organic particles and inorganic particles having optical transparency can be used as the particles. Examples of the shape of the particles include a sphere, a disk, a shape like a rugby ball, and an irregular shape. The particles may be any of hollow particles, porous particles, and solid particles.

Examples of organic particles include particles composed of any of polymethyl methacrylate, polyacrylic-styrene copolymer, melamine resin, polycarbonate, polystyrene, polyvinyl chloride, benzoguanamine-melamine-formaldehyde condensates, silicones, fluororesins, and polyester-based resins.

Examples of inorganic particles include particles composed of any of silica, alumina, zirconia, and titania.

The content of the particles is preferably 0.2 to 15.0 parts by mass, more preferably 0.5 to 10.0 parts by mass, and still more preferably 1.0 to 6.0 parts by mass with respect to 100 parts by mass of the binder resin.

The UV-absorbing layer may contain an additive such as an antistatic agent, a flame retardant, a thermal stabilizer, an antioxidant, an anti-gelling agent, and a surfactant in such a manner that the effect of the present invention is not inhibited.

The thickness of the UV-absorbing layer is preferably 0.1 to 20 µm, more preferably 0.5 to 15 µm, and still more preferably 1 to 10 µm.

In addition to the UV-absorbing layer, the optical film may include a functional layer such as an antifouling layer, an antistatic layer, a transparent conductive layer, an adhesive layer, and an antireflection layer.

In particular, it is preferable for the optical film to include an antireflection layer on the UV-absorbing layer. The optical film including an antireflection layer on the UV-absorbing layer has an increased transmittance for light from outside and tends to appear pale because of the increase of the amount of light from outside to reach the plastic film, thus being preferred in that the effect of the present invention can be advantageously exerted.

It is preferable for the optical film including an antireflection layer on the UV-absorbing layer to include a hard coat layer between the UV-absorbing layer and the antireflection layer or between the plastic film and the UV-absorbing layer.

<Antireflection Layer>

Examples of the structure of an antireflection layer include a monolayer structure of a low-refractive-index layer; and a laminated structure of a high-refractive-index layer and a low-refractive-index layer.

<<Low-Refractive-Index Layer>>

It is preferable to form the low-refractive-index layer at a position being on the UV-absorbing layer side of the plastic film and the most distant from the plastic film. Enhanced antireflection properties can be achieved by forming a high-refractive-index layer described later adjacent to the low-refractive-index layer on the side of the low-refractive-index layer closer to the plastic film.

The refractive index of the low-refractive-index layer is preferably 1.10 to 1.48, more preferably 1.20 to 1.45, more preferably 1.26 to 1.40, more preferably 1.28 to 1.38, and more preferably 1.30 to 1.35.

The thickness of the low-refractive-index layer is preferably 80 nm to 120 nm, more preferably 85 nm to 110 nm, and more preferably 90 nm to 105 nm. It is preferable that the thickness of the low-refractive-index layer be larger than the average particle diameter of low-refractive-index particles such as hollow particles.

Methods to form the low-refractive-index layer are roughly classified into wet methods and dry methods. Examples of the wet methods include a method of formation with a sol-gel method using a metal alkoxide or the like, a method of formation by applying a low-refractive-index resin such as fluororesin, and a method of formation by applying a coating solution for formation of the low-refractive-index layer, in which a resin composition contains low-refractive-index particles. Examples of the dry methods include a method of formation through physical vapor deposition or chemical vapor deposition for particles having a desired refractive index, the particles selected from low-refractive-index particles described later.

The wet methods are superior to the dry methods in terms of production efficiency, reduction of oblique reflective hue, and chemical resistance. Among the wet methods, the formation by applying a coating solution for formation of the low-refractive-index layer, in which a binder resin composition contains low-refractive-index particles, is preferred from the viewpoint of adhesion, water resistance, scratch resistance, and achievement of a low refractive index.

A low-refractive-index layer is typically positioned on the outermost surface of an optical film. Accordingly, low-refractive-index layers are desired to have good scratch resistance, and general-purpose low-refractive-index layers are thus designed to have a predetermined scratch resistance.

To lower refractive indices of low-refractive-index layers, hollow particles having a large particle diameter have been used as low-refractive-index particles in recent years. Even if no scratch is found by visual observation when the surface of such a low-refractive-index layer containing hollow particles having a large particle diameter is rubbed with an object having only fine solid matters (e.g., sand) attached thereto or an object having only oily matters attached thereto, a scratch may be generated by rubbing an object having both solid matters and oily matters attached thereto (hereinafter, reference is occasionally made to "oil-dust resistance" in relation to this phenomenon). The motion of rubbing with an object having solid matters and oily matters attached thereto corresponds, for example, to a motion of operating an image display device of touch panel type by a user with a finger to which oily matters contained in cosmetics, foods, and so on and sand contained in the air have been attached.

Imparting good oil-dust resistance to the low-refractive-index layer is preferred in that the effect of the low-refractive-index layer (e.g., prevention of reflection, suppression of rainbow unevenness) can be retained over a long period of time.

Such scratches as described above tend to be generated principally by partial defects or fall-out of hollow particles contained in the low-refractive-index layer. The cause therefor is inferred to be large unevenness formed by hollow particles in the surface of the low-refractive-index layer. Specifically, when the surface of the low-refractive-index layer is rubbed with a finger having solid matters and oily matters attached thereto, the finger moves on the surface of the low-refractive-index layer while the solid matters are still attached to the finger as the oily matters serve as a binder. Then, a phenomenon that parts of the solid matters (e.g., angular portions of sand) are entrapped in concave portions in the surface of the low-refractive-index layer and a phenomenon that solid matters entrapped in concave portions escape from the concave portions along with the finger and climb over convex portions (hollow particles) are likely to occur, and large force applied at this time to the convex portions (hollow particles) is inferred to cause hollow particles to be damaged or fall out. The resin itself positioned in concave portions is scratched by the friction with the solid matters, and the damage of the resin is inferred to facilitate the fall-out of hollow particles.

Figure 6:
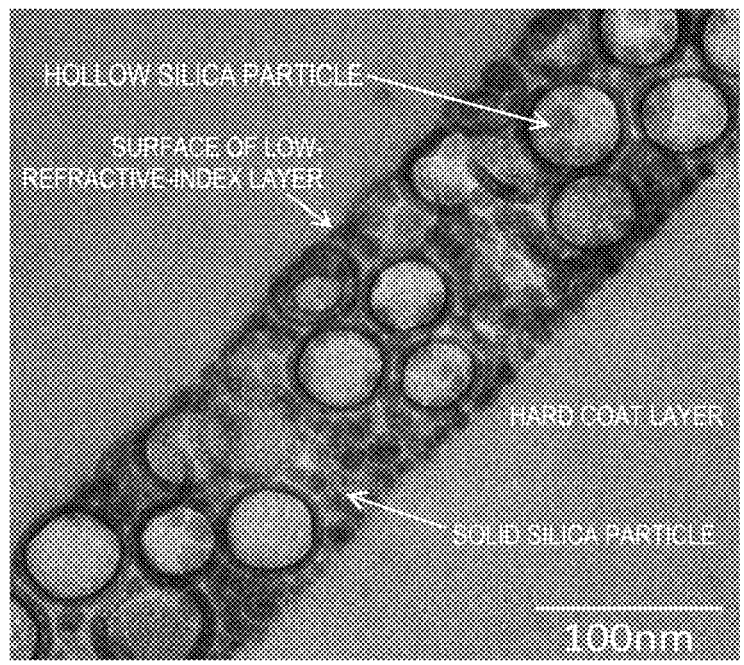
FIG. 6 is a cross-sectional photograph of an example of a low-refractive-index layer in which hollow particles and non-hollow particles are homogeneously dispersed.
Figure 7:
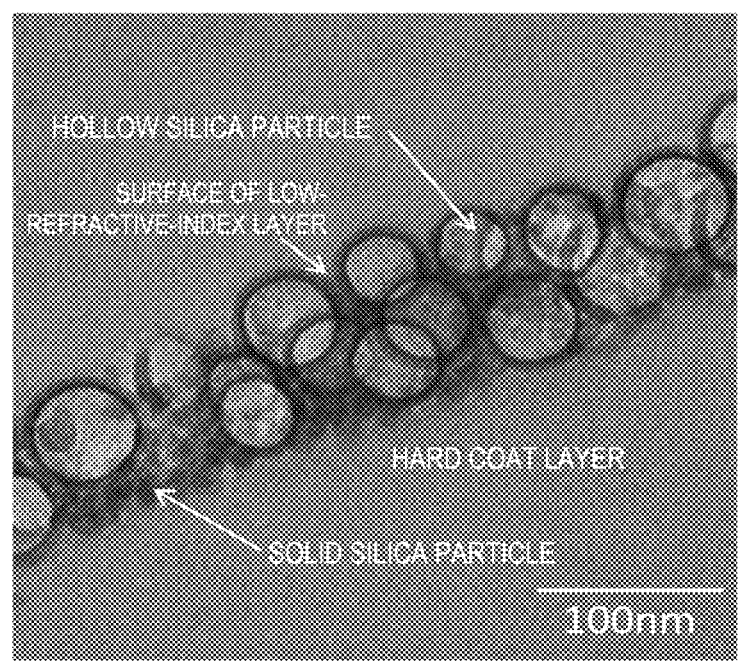
FIG. 7 is a cross-sectional photograph of an example of a low-refractive-index layer in which hollow particles and non-hollow particles are not homogeneously dispersed.

In a preferred embodiment of the present invention, good oil-dust resistance can be readily obtained by using hollow particles and non-hollow particles in combination as low-refractive-index particles and homogenously dispersing the hollow particles and non-hollow particles. FIG. 6 shows a cross-sectional photograph of a low-refractive-index layer in which hollow particles and non-hollow particles are homogenously dispersed, and FIG. 7 shows a cross-sectional photograph of a low-refractive-index layer in which hollow particles and non-hollow particles are not homogenously dispersed. The cross-sectional photographs in FIG. 6 and FIG. 7 were acquired through observation using the electron microscope H-7650 manufactured by Hitachi High-Technologies Corporation under conditions of emission current: 10 μA, acceleration voltage: 100 keV, filament voltage: 20 V.

To achieve good oil-dust resistance, it is preferable for the low-refractive-index particles to include hollow particles and non-hollow particles.

The material of the hollow particles and non-hollow particles may be any of inorganic compounds such as silica and magnesium fluoride and organic compounds; however, silica is preferred from the viewpoint of achievement of a low refractive index and strength. Now, hollow silica particles and non-hollow silica particles will be primarily described.

A hollow silica particle refers to a particle including an outer shell layer composed of silica, wherein the inside of the particle enclosed by the outer shell layer is a hollow space including air therein. The hollow silica particle is a particle whose refractive index is lower than the refractive index that silica originally has by means of inclusion of air, and decreases in proportion to the gas occupancy. A non-hollow silica particle is a particle whose inside is not a hollow space, in contrast to hollow silica particles. Non-hollow silica particles are, for example, solid silica particles.

The shape of hollow silica particles and non-hollow silica particles may be any of a true sphere, a spheroid, and a generally spherical shape such as a polyhedral shape that can be approximated to a sphere, but is not particularly limited thereto. In view of scratch resistance, it is preferable that the shape be a true sphere, a spheroid, or a generally spherical shape among them.

Because of the inclusion of air in the inside, hollow silica particles play a role to lower the refractive index of the low-refractive-index layer as a whole. The refractive index of the low-refractive-index layer can be further lowered by using hollow silica particles having a large particle diameter with an increased air ratio. On the other hand, hollow silica particles tend to be poor in mechanical strength. In particular, use of hollow silica particles having a large particle diameter with an increased air ratio often causes lowering of the scratch resistance of the low-refractive-index layer.

Non-hollow silica particles play a role to improve the scratch resistance of the low-refractive-index layer through dispersing in the binder resin.

To allow the binder resin to contain a high concentration of hollow silica particles and non-hollow silica particles and homogeneously disperse the particles in the resin in the film thickness direction, it is preferable to set the average particle diameter of hollow silica particles and the average particle diameter of non-hollow silica particles so that hollow silica particles can come close to each other and non-hollow particles can be placed among hollow silica particles. Specifically, the ratio of the average particle diameter of non-hollow silica particles to the average particle diameter of hollow silica particles (average particle diameter of non-hollow silica particles/average particle diameter of hollow silica particles) is preferably 0.29 or less, and more preferably 0.20 or less. The ratio of the average particle diameters is preferably 0.05 or more. In view of optical properties and mechanical strength, the average particle diameter of hollow silica particles is preferably 50 nm or larger and 100 nm or smaller, and more preferably 60 nm or larger and 80 nm or smaller. In view of dispersiveness together with prevention of the aggregation of non-hollow silica particles, the average particle diameter of non-hollow silica particles is preferably 5 nm or larger and 20 nm or smaller, and more preferably 10 nm or larger and 15 nm or smaller.

It is preferable that hollow silica particles and non-hollow silica particles be covered with a silane coupling agent. Use of a silane coupling agent having a (meth)acryloyl group or an epoxy group is more preferred.

Surface treatment of silica particles with a silane coupling agent improves the affinity between the silica particles and the binder resin, providing the silica particles with a less tendency to aggregate. Thus, homogenous dispersion is readily achieved for silica particles.

Examples of silane coupling agents include 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, tris-(trimethoxysilylpropyl) isocyanurate, 3-mercaptopropylmethyldimethoxysilane, 3-mercaptopropyltrimethoxysilane, 3-isocyanatepropyltriethoxysilane, methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, vinyltrimethoxysilane, and vinyltriethoxysilane. In particular, use of one or more selected from the group consisting of 3-methacryloxypropylmethyldimethoxysilane, 3-methacryloxypropyltrimethoxysilane, 3-methacryloxypropylmethyldiethoxysilane, and 3-methacryloxypropyltriethoxysilane is preferred.

The more the content of hollow silica particles, the higher the packing ratio of hollow silica particles in the binder resin, and thus the refractive index of the low-refractive-index layer is lowered. Hence, the content of hollow silica particles is preferably 100 parts by mass or more and more preferably 150 parts by mass or more with respect to 100 parts by mass of the binder resin.

If the content of hollow silica particles to the binder resin is excessively high, on the other hand, the number of hollow silica particles exposed from the binder resin is larger, and in addition the amount of the binder resin binding particles is smaller. Thus, hollow silica particles tend to be damaged or fall out to result in lowering of the mechanical strength, such as scratch resistance, of the low-refractive-index layer. For this reason, the content of hollow silica particles is preferably 400 parts by mass or less and more preferably 300 parts by mass or less with respect to 100 parts by mass of the binder resin.

If the content of non-hollow silica particles is low, the existence of non-hollow silica particles in the surface of the low-refractive-index layer may have no influence on increase of hardness. If a large amount of non-hollow silica particles is contained, the influence of inhomogeneous contraction due to the polymerization of the binder resin can be decreased, to result in smaller unevenness that is generated in the surface of the low-refractive-index layer after curing of the resin. Hence, the content of non-hollow silica particles is preferably 90 parts by mass or more and more preferably 100 parts by mass or more with respect to 100 parts by mass of the binder resin.

If the content of non-hollow silica particles is excessively high, on the other hand, non-hollow silica particles tends to aggregate, and inhomogeneous contraction occurs in the binder resin, leading to larger unevenness in the surface. Hence, the content of non-hollow silica particles is preferably 200 parts by mass or less and more preferably 150 parts by mass or less with respect to 100 parts by mass of the binder resin.

The barrier properties of the low-refractive-index layer can be improved by allowing the binder resin to contain hollow silica particles and non-hollow silica particles at the above ratios. This is inferred to be due to inhibition of the permeation of gas and so on because of silica particles homogeneously dispersed at a high packing ratio.

Cosmetics such as sunscreens and hand creams may contain a low-molecular-weight polymer with low volatility. Imparting good barrier properties to the low-refractive-index layer can suppress the permeation of a low-molecular-weight polymer into the inside of the coating film of the low-refractive-index layer, suppressing defects (e.g., abnormal appearance) due to a low-molecular-weight polymer remaining in the coating film for a long period of time.

It is preferable that the binder resin in the low-refractive-index layer contain a cured product of an ionizing radiation-curable resin composition. Compounds having an ethylenic unsaturated bond group are preferred as the ionizing radiation-curable compound contained in the ionizing radiation-curable resin composition. Among them, (meth)acrylate-based compounds having a (meth)acryloyl group are more preferred.

Hereinafter, (meth)acrylate-based compounds having four or more ethylenic unsaturated bond groups are referred to as "polyfunctional (meth)acrylate-based compounds". (Meth)acrylate-based compounds having two or three ethylenic unsaturated bond groups are referred to as "low-functional (meth)acrylate-based compounds".

(Meth)acrylate-based compounds in any of a monomer and an oligomer can be used. In particular, it is more preferable from the viewpoint of smoothing the uneven shape of the surface of the low-refractive-index layer by suppressing inhomogeneous contraction in curing that the ionizing radiation-curable compound contain a low-functional (meth)acrylate-based compound. Further, low-functional (meth)acrylate-based compounds are preferred in that they allow low-refractive-index particles (in particular, silica particles) to be homogeneously dispersed in the low-refractive-index layer with ease.

The proportion of the low-functional (meth)acrylate-based compound in the ionizing radiation-curable compound is preferably 60% by mass or more, more preferably 80% by mass or more, still more preferably 90% by mass or more, even still more preferably 95% by mass or more, and the most preferably 100% by mass.

It is preferable from the viewpoint of suppressing the above-described inhomogeneous contraction in curing and smoothing the uneven shape of the surface of the low-refractive-index layer that the low-functional (meth)acrylate-based compound be a (meth)acrylate-based compound having two ethylenic unsaturated bond groups.

Examples of bifunctional (meth)acrylate-based compounds among (meth)acrylate-based compounds include polyalkylene glycol di(meth)acrylate such as isocyanurate di(meth)acrylate, ethylene glycol di(meth)acrylate, polyethylene glycol diacrylate, and polybutylene glycol di(meth)acrylate, bisphenol A tetraethoxy diacrylate, bisphenol A tetrapropoxy diacrylate, and 1,6-hexanediol diacrylate.

Examples of trifunctional (meth)acrylate-based compounds include trimethylolpropane tri(meth)acrylate, pentaerythritol tri(meth)acrylate, and isocyanuric acid-modified tri(meth)acrylate.

Examples of tetra- or higher functional (meth)acrylate-based compounds include pentaerythritol tetra(meth)acrylate, dipentaerythritol hexa(meth)acrylate, and dipentaerythritol tetra(meth)acrylate.

These (meth)acrylate-based compounds may be modified as described later.

Examples of (meth)acrylate-based oligomers include acrylate-based polymers such as urethane (meth)acrylate, epoxy (meth)acrylate, polyester (meth)acrylate, and polyether (meth)acrylate.

Urethane (meth)acrylate is obtained, for example, by reaction of a polyhydric alcohol and organic diisocyanate with hydroxy (meth)acrylate.

Preferred epoxy (meth)acrylates are (meth)acrylates obtained by reacting a tri- or higher functional aromatic epoxy resin, alicyclic epoxy resin, aliphatic epoxy resin, or the like and (meth)acrylic acid; (meth)acrylates obtained by reacting a bi- or higher functional aromatic epoxy resin, alicyclic epoxy resin, aliphatic epoxy resin, or the like, a polybasic acid, and (meth)acrylic acid; and (meth)acrylates obtained by reacting a bi- or higher functional aromatic epoxy resin, alicyclic epoxy resin, aliphatic epoxy resin, or the like, a phenol, and (meth)acrylic acid.

From the viewpoint of enhancement of the smoothness of the surface by suppressing inhomogeneous contraction due to crosslinking, the molecular framework of the (meth)acrylate-based compound may be partially modified. For example, those modified with any of ethylene oxide, propylene oxide, caprolactone, isocyanuric acid, an alkyl, a cyclic alkyl, an aromatic, and bisphenol can be used as the (meth)acrylate-based compound. In particular, from the viewpoint of enhancement of the affinity with low-refractive-index particles (in particular, silica particles) to allow low-refractive-index particles (in particular, silica particles) to be homogeneously dispersed in the low-refractive-index layer with ease, the (meth)acrylate-based compound is preferable that modified with an alkylene oxide such as ethylene oxide and propylene oxide.

The proportion of the alkylene oxide-modified (meth)acrylate-based compound in the ionizing radiation-curable compound is preferably 60% by mass or more, more preferably 80% by mass or more, still more preferably 90% by mass or more, even still more preferably 95% by mass or more, and the most preferably 100% by mass. The alkylene oxide-modified (meth)acrylate-based compound is preferably a low-functional (meth)acrylate-based compound, and more preferably a (meth)acrylate-based compound having two ethylenic unsaturated bond groups.

Examples of (meth)acrylate-based compounds modified with an alkylene oxide and having two ethylenic unsaturated bond groups include bisphenol F alkylene oxide-modified di(meth)acrylate, bisphenol A alkylene oxide-modified di(meth)acrylate, isocyanurate alkylene oxide-modified di(meth)acrylate, and polyalkylene glycol di(meth)acrylate, and polyalkylene glycol di(meth)acrylate is preferred among them. It is preferable that the average number of repeating units of the alkylene glycol in the polyalkylene glycol di(meth)acrylate be three to five. It is preferable that the alkylene glycol in the polyalkylene glycol di(meth)acrylate be ethylene glycol and/or polyethylene glycol.

Examples of (meth)acrylate-based compounds modified with an alkylene oxide and having three ethylenic unsaturated bond groups include trimethylolpropane alkylene oxide-modified tri(meth)acrylate and isocyanurate alkylene oxide-modified tri(meth)acrylate.

One of the ionizing radiation-curable resins can be used singly, and two or more thereof can be used in combination.

It is preferable from the viewpoint of antifouling properties and surface smoothness that the low-refractive-index layer contain a leveling agent.

Examples of the leveling agent include fluorine-containing leveling agents and silicone-based leveling agents, and silicone-based leveling agents are preferred. A silicone-based leveling agent contained can make the low-reflectance layer more smooth. Further, better slidability and antifouling properties (easiness in removal of fingerprints, a large contact angle against pure water and hexadecane) can be imparted to the surface of the low-reflectance layer.

The content of the leveling agent is preferably 1 to 25 parts by mass, more preferably 2 to 20 parts by mass, and still more preferably 5 to 18 parts by mass with respect to 100 parts by mass of the binder resin. Setting the content of the leveling agent to 1 part by mass or more makes it easy to impart performances such as antifouling properties. The lowering of the scratch resistance can be reduced by setting the content of the leveling agent to 25 parts by mass or less.

The maximum height roughness, Rz, of the low-refractive-index layer is preferably 110 nm or smaller, more preferably 90 nm or smaller, still more preferably 70 nm or smaller, and even still more preferably 60 nm or smaller. Rz/Ra (Ra: arithmetical mean roughness) is preferably 12.0 or less, and more preferably 10.0 or less. Setting Rz/Ra within the range is particularly effective in the case of large Rz of about 90 nm to 110 nm.

Ra and Rz herein are values obtained by three-dimensional extension of two-dimensional roughness parameters described in an instruction for an upgrade kit for the scanning probe microscope SPM-9600 (SPM-9600, February 2016, pp. 194-195). Ra and Rz are defined as follows.

(Arithmetical Mean Roughness, Ra)

A roughness curve of reference length (L) is extracted from the roughness curve along in the direction of the mean line of the roughness curve; the direction of the mean line in the extracted portion is assumed as the X-axis and the direction representing vertical ratios is assumed as the Y-axis; when the roughness curve is represented by y=f(x), Ra is determined using the following expression.

$$Ra = \frac{1}{L}\int_0^L |f(x)|dx \qquad \text{[Expression 1]}$$

(Maximum Height Roughness, Rz)

A roughness curve of reference length is extracted from the roughness curve along in the direction of the mean line of the roughness curve; Rz is a value of distance between the ridge line and valley line of the extracted portion as measured in the direction representing vertical ratios.

Small Rz means that a convex portion due to a hollow silica particle in a microscopic region is small. In addition, small Rz/Ra means that unevenness due to silica particles in a microscopic region is homogeneous without any concave or convex portion largely deviating from the average difference in elevation of the unevenness. The numerical value of Ra in the present invention is preferably 15 nm or smaller, more preferably 12 nm or smaller, still more preferably 10 nm or smaller, and even still more preferably 6.5 nm or smaller, but is not particularly limited thereto.

The above ranges of Rz and Rz/Ra can be satisfied with ease by homogenously dispersing low-refractive-index particles in the low-refractive-index layer or suppressing inhomogeneous contraction in the low-refractive-index layer.

With Rz and Rz/Ra of the surface of the low-refractive-index layer being within the above ranges, the resistance when solid objects climb over convex portions (due to hollow silica particles present in the vicinity of the surface) in the surface of the low-refractive-index layer can be decreased. Accordingly, it is inferred that solid objects can smoothly move on the surface of the low-refractive-index layer even in rubbing with sand together with oily matters while a load is applied. In addition, the hardness of concave portions itself is inferred to be enhanced. As a result, the break and fall-out of hollow silica particles are expected to be prevented, and thus the damage of the binder resin itself is also expected to be prevented.

Unless otherwise specified, surface roughness such as Rz and Ra is a mean value of measurements at 14 positions with the minimum value and the maximum value excluded from measurements at 16 positions.

Herein, a region of 0.5 cm in width from the outer periphery of a measurement sample is excluded as a margin, lines that evenly divide the remaining region into five portions are drawn in the vertical direction and then in the horizontal direction, and the 16 resulting intersects are preferably used as the centers of measurement, that is, as the 16 measurement positions. It is preferable that the measurement sample have a size of 5 cm×5 cm.

The low-refractive-index layer can be formed by applying a coating solution for formation of the low-refractive-index layer, in which each component to constitute the low-refractive-index layer is dissolved or dispersed, and drying it. Typically, a solvent is used in the coating solution to control the viscosity, or to allow the respective components to be dissolved or dispersed.

Examples of the solvent include ketones (e.g., acetone, methyl ethyl ketone, methyl isobutyl ketone, cyclohexanone), ethers (e.g., dioxane, tetrahydrofuran), aliphatic hydrocarbons (e.g., hexane), alicyclic hydrocarbons (e.g., cyclohexane), aromatic hydrocarbons (e.g., toluene, xylene), halogenated hydrocarbons (e.g., dichloromethane, dichloroethane), esters (e.g., methyl acetate, ethyl acetate, butyl acetate), alcohols (e.g., butanol, cyclohexanol), cellosolves (e.g., methyl cellosolve, ethyl cellosolve), cellosolve acetates, sulfoxides (e.g., dimethyl sulfoxide), glycol ethers (e.g., 1-methoxy-2-propyl acetate), and amides (e.g., dimethylformamide, dimethylacetamide), and the solvent may be a mixture of any of them.

If the volatilization of the solvent is too fast, the solvent undergoes vigorous convection in drying the coating solution for formation of the low-refractive-index layer. Accordingly, even when silica particles are in a homogeneously dispersed state in the coating solution, the homogenously dispersed state is likely to be disrupted by the vigorous convection of the solvent in drying. Hence, the solvent preferably contains a solvent with a low evaporation rate. Specifically, it is preferable to contain a solvent with a relative evaporation rate (a relative evaporation rate when the evaporation rate of n-butyl acetate is assumed as 100) of 70 or lower, and it is more preferable to contain a solvent with a relative evaporation rate of 30 to 60. The amount of the solvent with a relative evaporation rate of 70 or lower is preferably 10 to 50% by mass and more preferable 20 to 40% by mass to the whole solvent.

Relative evaporation rates of solvents with a low evaporation rate are, for example, 64 for isobutyl alcohol, 47 for 1-butanol, 44 for 1-methoxy-2-propyl acetate, 38 for ethyl cellosolve, and 32 for cyclohexanone.

It is preferable that the residual component of the solvent (solvents other than the solvent with a low evaporation rate) be superior in dissolvability for the resin. It is preferable for the residual component of the solvent to have a relative evaporation rate of 100 or higher.

To suppress the convection of the solvent in drying to achieve good dispersibility of silica particles, it is preferable that the drying temperature in forming the low-refractive-index layer be as low as possible. The drying temperature can be appropriately set in view of the type of the solvent, the dispersibility of silica particles, the production rate, and so on.

<<High-Refractive-Index Layer>>

A high-refractive-index layer is formed, as necessary, closer to the plastic film side than the low-refractive-index layer. In the case that a hard coat layer described later is included, it is preferable to form the high-refractive-index layer between the hard coat layer and the low-refractive-index layer.

The refractive index of the high-refractive-index layer is preferably 1.53 to 1.85, more preferably 1.54 to 1.80, more preferably 1.55 to 1.75, and more preferably 1.56 to 1.70.

The thickness of the high-refractive-index layer is preferably 200 nm or smaller, more preferably 50 nm to 180 nm, and still more preferably 70 nm to 150 nm. In the case that a high-refractive-index hard coat layer is formed, it is preferable to employ a thickness in view of the thickness of the hard coat layer.

The high-refractive-index layer can be formed with a coating solution for formation of the high-refractive-index layer, for example, containing a binder resin composition and high-refractive-index particles. Examples of the binder resin composition include curable resin compositions, which will be exemplified in context of a hard coat layer described later.

Examples of the high-refractive-index particles include antimony pentoxide (1.79), zinc oxide (1.90), titanium oxide (2.3 to 2.7), cerium oxide (1.95), tin-doped indium oxide (1.95 to 2.00), antimony-doped tin oxide (1.75 to 1.85), yttrium oxide (1.87), and zirconium oxide (2.10).

The average particle diameter of the high-refractive-index particles is preferably 2 nm or larger, more preferably 5 nm or larger, and still more preferably 10 nm or larger. From the viewpoint of suppression of whitening and transparency, the average particle diameter of the high-refractive-index particles is preferably 200 nm or smaller, more preferably 100 nm or smaller, more preferably 80 nm or smaller, more preferably 60 nm or smaller, and more preferably 30 nm or smaller. The smaller the average particle diameter of the high-refractive-index particles is, the better the transparency is, and, in particular, very good transparency can be obtained with an average particle diameter of 60 nm or smaller.

The average particle diameter of the high-refractive-index particles or low-refractive-index particles can be calculated through the following operations (y1) to (y3).

(y1) A photograph of a cross-section of the high-refractive-index layer or low-refractive-index layer is taken with TEM or STEM. It is preferable to set the acceleration voltage and rate of magnification in TEM or STEM to 10 kV to 30 kV and 50000× to 300000×, respectively.

(y2) Ten particles are arbitrarily extracted from the observed image, and the particle diameter of each particle is calculated. The cross-section of a particle is sandwiched between two arbitrary parallel lines, a combination of two lines that gives the maximum line-to-line distance therebetween is determined, and this line-to-line distance is determined as the particle diameter. When particles are aggregating, the aggregate of particles is regarded as one particle and subjected to measurement.

(y3) The same operations are performed five times for other observed images of the same sample, and a value obtained through arithmetical averaging of particle diameters of 50 particles in total is determined as the average particle diameter of the high-refractive-index particles or low-refractive-index particles.

<<Hard Coat Layer>>

A hard coat layer is formed, as necessary, to improve the scratch resistance of the optical film. The hard coat layer can be disposed, for example, between the UV-absorbing layer and the antireflection layer, or between the plastic film and the UV-absorbing layer, and it is preferable to dispose the hard coat layer between the UV-absorbing layer and the antireflection layer.

From the viewpoint of scratch resistance, it is preferable for the hard coat layer to contain a cured product of a curable resin composition such as a thermosetting resin composition and an ionizing radiation-curable resin composition, and it is more preferable to contain a cured product of an ionizing radiation-curable resin composition.

Thermosetting resin compositions are compositions at least containing a thermosetting resin, and are resin compositions that cure by heating. Examples of thermosetting resins include acrylic resins, urethane resins, phenolic resins, urea-melamine resins, epoxy resins, unsaturated polyester resins, and silicone resins. For a thermosetting resin composition, a curing agent is added to such a curable resin, as necessary.

Ionizing radiation-curable resin compositions are compositions containing a compound having an ionizing radiation-curable functional group (hereinafter, also referred to as "ionizing radiation-curable compound"). Examples of ionizing radiation-curable functional groups include ethylenic unsaturated bond groups such as a (meth)acryloyl group, a vinyl group, and an allyl group, an epoxy group, and an oxetanyl group. Compounds having an ethylenic unsaturated bond group are preferred as ionizing radiation-curable compounds, and compounds having two or more ethylenic unsaturated bond groups are more preferred. Among them, (meth)acrylate-based compounds having two or more ethylenic unsaturated bond groups are still more preferred. (Meth)acrylate-based compounds having two or more ethylenic unsaturated bond groups in any of a monomer and an oligomer can be used.

Ionizing radiation refers to an electromagnetic wave or charged particle beam having an energy quantum that can cause molecules to polymerize or crosslink, and an ultraviolet ray (UV) or an electron beam (EB) is typically used therefor; however, other electromagnetic waves such as X-rays and γ-rays and other charged particle beams such as α-rays and ion beams are also applicable.

Herein, (meth)acrylate refers to acrylate or methacrylate, (meth)acrylic acid refers to acrylic acid or methacrylic acid, and a (meth)acryloyl group refers to an acryloyl group or a methacryloyl group.

From the viewpoint of scratch resistance, the thickness of the hard coat layer is preferably 0.1 µm or larger, more preferably 0.5 µm or larger, still more preferably 1.0 µm or larger, and even still more preferably 2.0 µm or larger. From the viewpoint of suppression of curling, the thickness of the hard coat layer is preferably 100 µm or smaller, more preferably 50 µm or smaller, more preferably 30 µm or smaller, more preferably 20 µm or smaller, more preferably 15 µm or smaller, and more preferably 10 µm or smaller.

<UV Transmittance>

The spectral transmittance of the optical film at a wavelength of 380 nm is preferably 15% or less, more preferably 10% or less, and still more preferably 8% or less. If the spectral transmittance at a wavelength of 380 nm is set to be excessively low, the amount of the UV-absorbing agent that should be added is too much, and a problem of bleed-out is likely to arise. For this reason, the spectral transmittance at a wavelength of 380 nm is preferably 0.3% or more, and more preferably 0.4% or more.

<Haze Value>

In the case that the optical film includes no anti-glare layer, it is preferable that the haze value (JIS K7136: 2000) of the optical film be 1% or less.

In the case that the optical film includes an anti-glare layer, the haze value of the whole optical film is affected by the uneven shape and internal scattering properties of the anti-glare layer, and the preferred range depends on whether image sharpness is valued or anti-glare properties are valued. If image sharpness is the most valued for inclusion of an anti-glare layer, the upper limit of the haze value of the whole optical film is preferably 10% or less, more preferably 5% or less, still more preferably 3% or less, and even still more preferably 1% or less, and the lower limit is preferably 0.5% or more. If anti-glare properties are the most valued for inclusion of an anti-glare layer, the lower limit of the haze value is preferably 3% or more, and the upper limit is preferably, but not particularly limited to, 50% or less to suppress excessive whiteness.

<Total Light Transmittance>

The total light transmittance (JIS K7361-1: 1997) of the optical film is preferably 80% or more, more preferably 90% or more, and still more preferably 93% or more.

<Total Thickness>

It is preferable to change the total thickness of the optical film according to the application.

When the optical film is applied to an image display device of curved shape or foldable image display device, the total thickness is preferably 20 to 110 µm, more preferably 22 to 75 µm, still more preferably 25 to 70 µm, and even still more preferably 30 to 55 µm, from the viewpoint of folding resistance. From the viewpoint of better folding resistance, the in-plane retardation (Re) of the plastic film is preferably 1400 nm or less, more preferably 1000 nm or less, still more preferably 850 nm or less, and even still more preferably 500 nm or less, with the total thickness satisfying the range.

When the optical film is applied to a flat, large-screen image display device (maximum dimension: 1300 mm or larger), the total thickness is preferably 25 to 160 µm, more preferably 30 to 95 µm, still more preferably 32 to 80 µm, and even still more preferably 35 to 65 µm.

When the optical film is applied to a flat image display device (maximum dimension: smaller than 1300 mm), the total thickness is preferably 20 to 140 µm, more preferably 25 to 80 µm, still more preferably 27 to 70 µm, and even still more preferably 30 to 60 µm.

<Applications>

For example, the optical film can be disposed for use on the light emitting surface side of a display element of an image display device, and more specifically, can be used as a surface protective film for image display devices, a transparent protective plate for polarizers (in particular, a transparent protective plate in the light emitting side), or a structural member of touch panels (e.g., a base material of conductive films).

[Polarizing Plate]

The polarizing plate (30) of the present invention includes: a polarizer (31); a transparent protective plate A (32) disposed on one side of the polarizer (31); and a transparent protective plate B (33) disposed on the other side of the polarizer (31), wherein at least one of the transparent protective plate A (32) and the transparent protective plate B (33) is the above-described optical film (10) of the present invention, and the optical film (10) is disposed in such a manner that, with respect to the plastic film (11), the surface of the optical film (10) on the UV-absorbing layer (12) side faces the opposite side of the polarizer (31).

<Polarizer>

Polarizers include sheet-like polarizers for instance polyvinyl alcohol films, polyvinyl formal films, polyvinyl acetal films, and ethylene-vinyl acetate copolymer-based saponified films, dyed with iodine, etc., and oriented; wire grid type polarizers composed of many metal wires arranged in parallel; coating-type polarizers to which a lyotropic liquid crystal or a dichroic guest-host material is applied; and multilayer thin film type polarizers. Further, these polarizers may be reflection type polarizers provided with the function of reflecting the polarization component that is not transmitted.

<Transparent Plate>

A transparent plate A is disposed on one side of the polarizer, and a transparent plate B is disposed on the other side of the polarizer.

Examples of the transparent plate A and transparent plate B include plastic films and glass. Examples of such plastic films include polyester films, polycarbonate films, cycloolefin polymer films, and acrylic films, and oriented films of them are preferred from the viewpoint of mechanical strength. Examples of glass include alkali glass, nitride glass, soda-lime glass, borosilicate glass, and lead glass. It is preferable that glass used as a transparent plate to protect the polarizer is also used as another member of an image display device. For example, it is preferable for the glass to be used as a glass substrate of a liquid crystal display element and also as a transparent plate to protect the polarizer.

It is preferable to laminate the polarizer and each transparent plate via an adhesive. General-purpose adhesives can be used, and PVA-based adhesives are preferred.

In the polarizing plate of the present invention, each of the transparent plate A and the transparent plate B may be the above-described optical film of the present invention; however, it is preferable that one of the transparent plate A and the transparent plate B be the above-described optical film of the present invention. It is preferable that the transparent plate on the light emitting surface side of the polarizer (in FIG. 4, the transparent plate A (32)) be the above-described optical film of the present invention.

It is preferable from the viewpoint of suppression of rainbow unevenness to dispose the absorption axis of the polarizer and the slow axis of the plastic film constituting the optical film of the present invention to be generally parallel or generally orthogonal to each other. Being generally parallel means being within 0 degrees±30 degrees, preferably being within 0 degrees±10 degrees, still more preferably being within 0 degrees±5 degrees, more preferably being within 0 degrees±2 degrees, and still more preferably being within 0 degrees±1 degree. Being generally orthogonal means being within 90 degrees±30 degrees, preferably being within 90 degrees±10 degrees, still more preferably being within 90 degrees±5 degrees, more preferably being within 90 degrees±2 degrees, and still more preferably being within 90 degrees±1 degree.

It is preferable that the maximum dimension of the polarizing plate of the present invention be 1300 mm or larger. If the maximum dimension of the polarizing plate is 1300 mm or larger, when the polarizing plate is incorporated in an image display device, a problem of fluorescence emission is likely to arise in any of the right and left edge regions of the image display device, and hence the effect of the configuration of the present invention can be advantageously exerted in an effective manner. It is preferable that the maximum dimension of the polarizing plate be 1300 to 3100 mm.

The maximum dimension of the polarizing plate refers to the maximum length of lines drawn between two arbitrary points in the plane of the polarizing plate. If the polarizing plate is rectangular, for example, each diagonal of the area corresponds to the maximum dimension. If the polarizing plate is circular, the diameter corresponds to the maximum dimension.

The embodiment of the optical film used as a transparent plate of the polarizing plate is the same as the embodiment of the above-described optical film of the present invention. For example, it is preferable that the plastic film constituting the optical film used as a transparent plate of the polarizing plate be a polyester film. Further, it is preferable that the plastic film constituting the optical film used as a transparent plate of the polarizing plate be an oriented plastic film. The thickness, T, of the plastic film constituting the optical film used as a transparent plate of the polarizing plate is not limited, but preferably as small as possible such as 150 µm or smaller, and more preferably 15 to 60 µm (it is preferable to further adjust the thickness according to the type of an image display device for application). When the in-plane retardation of the plastic film constituting the optical film used as a transparent plate of the polarizing plate is defined as Re and the retardation in the thickness direction thereof is defined as Rth, it is preferable that Re/Rth be 0.25 or less. It is preferable for the UV-absorbing layer constituting the optical film used as a transparent plate of the polarizing plate that the UV-absorbing agent B satisfy the condition 3-1 and/or the condition 3-2.

[Image Display Device]

The image display device of the present invention includes: a display element; and an optical film disposed on the light emitting surface side of the display element, wherein the image display device includes, as the optical film, an optical film X being the above-described optical film of the present invention, the optical film X is disposed in such a manner that, with respect to the plastic film, the surface of the optical film X on the UV-absorbing layer side is on the light emitting surface side.

Figure 3:
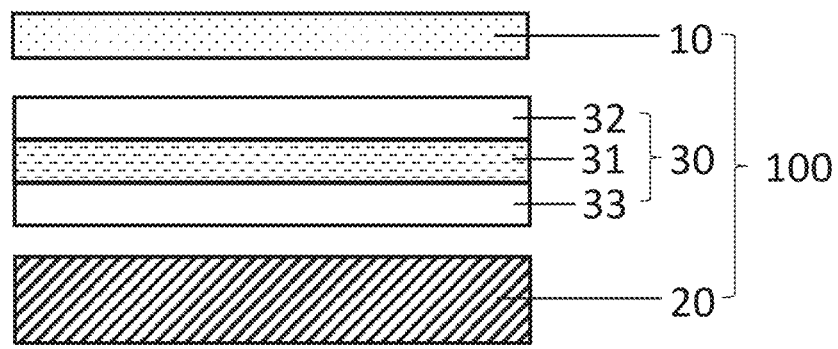
FIG. 3 is a cross-sectional view illustrating an embodiment of the image display device of the present invention.
Figure 4:
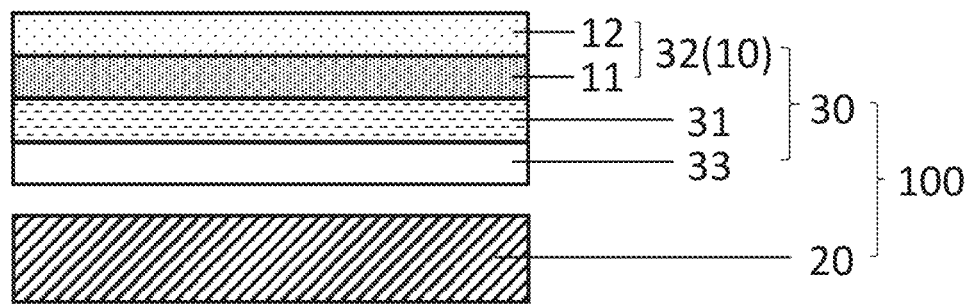
FIG. 4 is a cross-sectional view illustrating another embodiment of the image display device of the present invention.

FIG. 3 and FIG. 4 are each a cross-sectional view illustrating an example of a first embodiment of the image display device 100 of the present invention.

The image display device 100 in FIG. 3 and FIG. 4 includes the above-described optical film 10 of the present invention (optical film X) on the light emitting surface side (upper side in FIG. 3 and FIG. 4) of a display element 20. Although not shown in FIG. 3 and FIG. 4, the optical film X in the image display device 100 is disposed in such a manner that, with respect to the plastic film, the surface of the optical film 10 on the UV-absorbing layer 12 side is on the light emitting surface side.

In each of FIG. 3 and FIG. 4, the image display device 100 includes a polarizer 31 between the display element 100 and the optical film 10. In each of FIG. 3 and FIG. 4, a transparent protective plate A (32) or a transparent protective plate B (33) is laminated on each surface of the polarizer 31. For the image display device in FIG. 4, the above-described optical film 10 of the present invention is used as the transparent protective plate A (32).

The image display device 100 is not limited to the forms of FIG. 3 and FIG. 4. Although each member constituting the image display device 100 is disposed at a certain interval in each of FIG. 3 and FIG. 4, for example, the respective members may be integrated, for example, via adhesive layers. The image display device may include a member not shown (another optical film, functional layer, or the like).

<Effective Display Area>

It is preferable that the maximum dimension of the effective display area of the image display device of the present invention be 1300 mm or larger. If the maximum dimension of the effective display area is 1300 mm or larger, a problem of fluorescence emission is likely to arise in any of the right and left edge regions of the image display device, and hence the effect of the configuration of the present invention can be advantageously exerted in an effective manner.

It is preferable that the maximum dimension of the effective display area be 1300 to 3100 mm.

Figure 5:
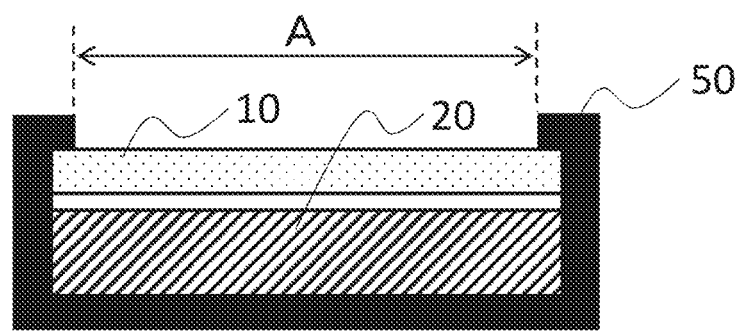
FIG. 5 FIG. 5 is a cross-sectional view for describing the effective display area of the image display device of the present invention.

The effective display area of the image display device refers to an area that can display an image. If the image display device 100 includes a housing 50 covering the display element 20 as shown in FIG. 5, for example, the area inside of the housing 50 corresponds to the effective display area, A.

Herein, the maximum dimension of the effective display area refers to the maximum length of lines drawn between two arbitrary points in the effective display area. If the effective display area is rectangular, for example, each diagonal of the area corresponds to the maximum dimension. If the effective display area is circular, the diameter of the area corresponds to the maximum dimension.

<Display Element>

Examples of the display element include liquid crystal display elements, EL display elements (organic EL display elements, inorganic EL display elements), and plasma display elements, and further examples are LED display elements such as micro-LED display elements.

If the display element of the display device is a liquid crystal display element, a back light is required in the surface of the liquid crystal display element in the opposite side of the resin sheet.

The image display device may be an image display device provided with a touch-panel function.

Examples of the types of touch panels include resistance film type, capacitance type, electromagnetic induction type, infrared type, and ultrasonic type.

A touch-panel function may be imparted within the display element as in-cell touch-panel liquid crystal display elements, and a touch panel may be placed on the display element.

The image display device of the present invention may include a plurality of optical films above the display element. If a plurality of optical films is included above the display element, it is preferable that the optical film positioned in the outermost on the light emitting surface side be the above-described optical film of the present invention (optical film X).

It is also preferable that the image display device of the present invention be of curved shape or be foldable.

As described above, image display devices of curved shape or foldable are often used in an environment in which light from outside enters the display screen at a small angle, the screen tends to appear pale in this case, and this is preferred in that the effect of the present invention can be advantageously exerted.

<Other Optical Films>

Examples of other optical films include retardation films such as λ/4 films, λ/2 films, +C plates, and −C plates, transparent conductive films, polarizer-protecting films, and surface protective films.

<Polarizer>

The image display device of the present invention may include a polarizer between the display element and the optical film X.

The embodiment of the polarizer constituting the image display device of the present invention is the same as the embodiment of the polarizer constituting the above-described polarizing plate of the present invention.

It is preferable to cover each side of the polarizer with a transparent protective plate, such as a plastic film and glass. It is preferable for the image display device of the present invention that the optical film X be used as the transparent protective plate on the light emitting side of the polarizer.

The polarizer is used, for example, in order to impart antireflection properties by combination with a λ/4 plate. Additionally, when the display element is a liquid crystal display element, a backside polarizer is provided on the light entering surface side of the liquid crystal display element, and is used for imparting the function of a liquid crystal shutter by disposing the absorption axes of the polarizers positioned on the upper and lower sides of the liquid crystal display element to be orthogonal to each other.

In principle, the polarized sunglasses absorb the S polarization. Thus, in principle, the direction of the absorption axis of the polarizer of the polarized sunglasses is also horizontal. For this reason, it is preferable to provide the polarizer (the polarizer positioned on the light emitting side of the display element) in such a manner that the angle of the direction of the absorption axis of the polarizer is within the range less than ±10 degrees with respect to the horizontal direction of the image display device. It is more preferable to provide in such a manner that the angle is within the range less than ±5 degrees.

From the viewpoint of suppression of rainbow unevenness, it is preferable to dispose the absorption axis of the polarizer and the slow axis of the plastic film constituting the optical film of the present invention to be generally parallel or generally orthogonal to each other. Specific numerical ranges for being generally parallel and being generally orthogonal are the same as those for being generally parallel and being generally orthogonal with regard to the above-described polarizing plate of the present invention.

<Surface Plate>

It is preferable that a surface plate be provided on the outermost surface of the image display device of the present invention in order to protect the display element.

From the viewpoint of weight reduction, it is preferable that the surface plate is a surface plate made of resin. If the surface plate is made of glass, the fluorescence emission of the optical film, which is positioned on the light entering side of the glass, is less likely to occur because of the UV absorption properties of the glass. For this reason, the case that the surface plate is a surface plate made of resin is preferred in that the effect of the present invention is significantly exhibited.

Even when a surface plate made of glass is used, if the optical film X is provided closer to the light emitting surface side than the surface plate, this case is preferred in that the effect of the present invention is significantly exhibited.

The surface plate made of resin may be a monolayer plastic film, or a product obtained by laminating a plurality of plastic films via adhesive layers. Use of a product obtained by laminating the optical film X on another plastic film as the surface plate is also a preferred embodiment.

The total thickness of the surface plate made of resin is preferably 10 to 1000 μm, and more preferably 300 to 800 μm.

[Surface Plate for Image Display Device]

The surface plate of the present invention for an image display device is formed by laminating an optical film on a resin plate or a glass plate, wherein the optical film is the above-described optical film of the present invention, and the optical film is disposed in such a manner that, with respect to the plastic film, the surface of the optical film on the UV-absorbing layer side faces the opposite side of the resin plate or the glass plate.

It is preferable to dispose the surface plate of the present invention for an image display device in such a manner that the surface with the optical film laminated thereon faces the surface side (the opposite side of the display element).

For the resin plate or glass plate, those versatilely used for surface plates of image display devices can be used.

The thickness of the resin plate or glass plate is preferably 10 to 1000 μm and more preferably 300 to 800 μm. It follows that the total thickness of the surface plate of the present invention, in which the above optical film is disposed on a surface plate, is about "thickness of resin plate or glass plate+total thickness of optical film". The preferred range of the total thickness of the surface plate is 30 to 1110 μm when the surface plate is applied to an image display device of curved shape or a foldable image display device, 35 to 1160 μm when the surface plate is applied to a flat, large-screen image display device (maximum dimension: 1300 mm or larger), and 30 to 1140 μm when the surface plate is applied to a flat image display device (maximum dimension: smaller than 1300 mm).

EXAMPLES

Next, the present invention will be described in more detail with reference to Examples; however, the present invention is not limited in any way by these Examples. In each measurement and evaluation, an atmosphere with a temperature of 23° C.±5° C. and a humidity of 40 to 65% was used. Before the measurements and evaluations, samples were exposed to the atmosphere for 30 minutes or longer. Table 1 shows the results.

1. Measurements, Evaluation 1-1. Fluorescence Emission

An optical film of each of Examples and Comparative Examples was cut to fabricate a sample having a size of 50 mm in length×50 mm in width. The sample was set on a solid sample holder in a spectrofluorometer (model: "F-7000") manufactured by Hitachi High-Tech Science Corporation, and the fluorescence spectrum was measured with an excitation wavelength of 365 nm under conditions shown below. The measurement wavelength interval was 1 nm. The light source was a xenon lamp.

Measurement for optical films of Examples was carried out for the case that the light entering surface for excitation light was on the plastic film side and for the case that the light entering surface for excitation light was on the UV-absorbing layer side, and SL1/BL1 in the formula (1) was calculated. Although optical films of Comparative Examples each theoretically give the same fluorescence spectrum irrespective of which side the light entering surface for excitation light is on, fluorescence spectra for both sides were measured just in case, and the ratio was calculated.

<Measurement Conditions>
  Measurement mode: wavelength scan
  Scan mode: fluorescence spectrum
  Data mode: fluorescence
  Wavelength at beginning of fluorescence: 380.0 nm
  Wavelength at end of fluorescence: 780.0 nm
  Scan speed: 240 nm/min
  Initial (stable) waiting time: 0.0 s
  Slit on excitation side: 5.0 nm
  Slit on fluorescence side: 5.0 nm
  Photo multiplier voltage: 400 V
  Response: automatic
  Spectrum correction: On
  Shutter control: On
<Apparatus Function>
  Excitation side (200 to 500 nm) slit: 5.0/20.0 nm, photo multiplier voltage: 400V
  Fluorescence side (200 to 500 nm) slit: 5.0/20.0 nm, photo multiplier voltage: 250V
  Fluorescence side (500 to 900 nm) slit: - - - /5.0 nm, photo multiplier voltage: 400V
  Excitation side (500 to 900 nm) slit: 5.0/20.0 nm, photo multiplier voltage: 350V
<Peak Detection>
  Detection method: Rectangular
  Sensitivity: 1
  Threshold: 0.1

1-2. In-Plane Retardation (Re) and Retardation in Thickness Direction (Rth)

The in-plane retardation and retardation in the thickness direction of each of oriented polyester films A to C fabricated or prepared in "2" described later were measured using "RETS-100 (measurement spot: 5 mm in diameter), a product name, manufactured by Otsuka Electronics Co., Ltd". The procedures of measurement were carried out according to (A1) to (A4) in the text of the present specification.

1-3. Surface Alignment Ratio

According to the text of the present specification, the surface alignment ratio of each of oriented polyester films A to C fabricated or prepared in "2" described later was measured using an FT-IR measurement apparatus (product name: NICOLET6700, measurement spot: 2 mm in diameter), manufactured by Thermo Fisher Scientific.

1-4. UV Transmittance

For each of optical films of Examples and Comparative Examples, spectral transmittance at a wavelength of 380 nm was measured using a spectrophotometer (manufactured by Shimadzu Corporation, product name: UV-2450). For optical films including a UV-absorbing layer, the UV-absorbing layer side with respect to the plastic film was used for the light entering surface.

1-5. Evaluation of Large-Screen Image Display Device (Paleness)

An image display device fabricated in each of Examples and Comparative Examples was placed along a wall in a room. The room lighting was turned off and sunlight was blocked with a shading curtain to make a dark room (3 Lx or less). A black light with a center wavelength of 365 nm (manufactured by EISHIN KAGAKU CO., LTD., product name: UV-LED LIGHT PB-365, ultraviolet illuminance at irradiation distance of 40 cm: 6000 µW/cm$^2$ or more) was prepared, and the image display device was irradiated from the right diagonal direction of 45 degrees with the black light at a position 60 cm away. Thereafter, the image display device being powered off was visually evaluated on whether a region around an edge portion (primarily, a region within approximately 20 mm from the left edge portion) of the image display device appeared pale or not. A tester stood or sat in front of the image display device, and evaluated 1 m away therefrom in direct distance. The tester observed every part of the display area by standing up or sitting down.

Twenty testers evaluated the image display device, giving 2 points for no pale appearance was found in a region around an edge portion, 1 point for neither, and 0 points for pale appearance was found in a region around an edge portion. The average point was calculated and evaluation was made in accordance with the following criteria.
  A: The average point was more than 1.6
  B: The average point was more than 1.3 and 1.6 or less
  C: The average point was more than 1.0 and 1.3 or less
  D: The average point was more than 0.5 and 1.0 or less
  E: The average point was 0.5 or less 1-6. Evaluation of Curved Image Display Device (Paleness)

Prepared was a cylinder having a diameter of 50 mm and a black surface. The cylinder was wrapped with an optical film of each of Examples and Comparative Examples to fabricate a simulated image display device of curved shape (hereinafter, referred to as "sample"). For optical films including a UV-absorbing layer, fabrication was carried out to dispose so that the UV-absorbing layer side with respect to the plastic film faced the opposite side of the cylinder.

Under indoor fluorescent lighting (600 to 1500 Lx), various parts of the sample were visually observed from various angles to visually evaluate on whether to appear pale or not. The distance between the sample and a tester was 1 m. The tester observed every part of the display area by standing up or sitting down.

Twenty testers evaluated the sample, giving 2 points for the sample did not appear pale from any angle and at any part, 1 point for neither, and 0 points for the sample appeared pale from a certain angle or at a certain part. The average point was calculated and evaluation was made in accordance with the following criteria.
  A: The average point was more than 1.6
  B: The average point was more than 1.3 and 1.6 or less
  C: The average point was more than 1.0 and 1.3 or less
  D: The average point was more than 0.5 and 1.0 or less
  E: The average point was 0.5 or less 1-7. Evaluation of Image Display Device (Rainbow Unevenness)

An image display device fabricated in each of Examples and Comparative Examples was turned on in a dark room environment (3 Lx or less), and visually observed from various angles to evaluate on the presence or absent of rainbow unevenness.

Twenty testers evaluated the image display device, giving 2 points for no rainbow unevenness was visible, 1 point for neither, and 0 points for any rainbow unevenness was clearly visible. The average point was calculated and evaluation was made in accordance with the following criteria. Each rater observed every part of the display area by standing up or sitting down.
  A: The average point was 1.5 or more
  B: The average point was more than 1.0 and less than 1.5
  C: The average point was more than 0.5 and 1.0 or less
  D: The average point was 0.5 or less 2. Fabrication and Preparation of Oriented Polyester Films
[Oriented Polyester Film A]

With a kneader, 1 kg of PET (melting point: 258° C., absorption center wavelength: 320 nm) and 0.1 kg of a UV-absorbing agent A (benzoxazinone-based UV-absorbing agent, SUN CHEMICAL COMPANY LTD.: CYASORB UV-3638, maximum absorption wavelength: 350 nm) were melt-blended at 280° C. to produce pellets containing the UV-absorbing agent A. The pellets and PET with a melting point of 258° C. were put into a uniaxial extruder, melt-kneaded at 280° C., extruded from a T-die, and cast on a casting drum the surface temperature of which was controlled to 25° C. to obtain a casting film. The amount of the UV-absorbing agent A in the casting film was 1 part by mass with respect to 100 parts by mass of PET.

The casting film obtained was heated with a group of rolls set to 95° C., then oriented in the longitudinal direction of the film at an orientation ratio of 3.3 times within a 400-mm orientation section while both sides of the film were rapidly heated with a radiation heater to control the film temperature during orientation to 103° C., and thereafter temporarily cooled. Subsequently, both surfaces of the uniaxially oriented film were subjected to corona discharge treatment in air to set the wet tension of the base material film to 55 mN/m, and a coating solution for slippery layers containing a polyester resin with a glass transition temperature of 18° C., a polyester resin with a glass transition temperature of 82° C., and silica particles with an average particle diameter of 100 nm was applied to both surfaces of the film after being subjected to corona discharge treatment by in-line coating, and thus slippery layers were formed.

Next, the uniaxially oriented film was introduced into a tenter, pre-heated with hot air at 95° C., and then oriented in the transverse direction of the film at an orientation ratio of 4.5 times at a temperature of 105° C. in the first step and 140° C. in the second step. Here, two-step orientation was carried out in such a manner that as the section for transverse orientation was bisected, the degree of orientation of the film (film width at point of measurement—film width before orientation) at the intermediate point of the section for transverse orientation reached 80% of the degree of orientation at the end of the section for transverse orientation. The transversely oriented film was directly subjected to heat treatment with hot air in the tenter at stepwise heat treatment temperatures from 180° C. to 225° C., subsequently subjected to 1%-relaxation treatment in the transverse direction under the same temperature conditions, further rapidly cooled to 100° C., and then subjected to 1%-relaxation treatment in the transverse direction. Thereafter, the film was wound to obtain an oriented polyester film A having a thickness of 28 μm.

[Oriented Polyester film B]

An oriented polyester film B was obtained in the same manner as for the oriented polyester film A, except that the thickness of the casting film was changed to set the thickness after biaxial orientation to 36 μm.

[Oriented Polyester Film C]

A commercially available uniaxially oriented polyester film was prepared as an oriented polyester film C. The uniaxially oriented polyester film has a laminated structure in which a polyester resin layer containing no UV-absorbing agent is laminated on each side of a polyester resin layer containing a UV-absorbing agent.

[Oriented Polyester Film D]

An oriented polyester film D was obtained in the same manner as for the oriented polyester film A, except that the thickness of the casting film was changed to set the thickness after biaxial orientation to 48 μm and that the degree of orientation of the film (film width at point of measurement–film width before orientation) at the intermediate point of the section for transverse orientation was changed to 70% of the degree of orientation at the end of the section for transverse orientation.

3. Fabrication and Preparation of Optical Films, Fabrication of Polarizing Plates, and Fabrication of Image Display Devices Example 1

A coating solution for formation of a UV-absorbing layer with a formulation shown below was applied to one surface of the oriented polyester film A fabricated in "2" above, dried, and irradiated with an ultraviolet ray to form a UV-absorbing layer having a thickness of 5 μm, and thus an optical film (optical film X) of Example 1 was obtained. To fit to the size of an image display device described later, this optical film was cut to a size of 1444 mm in diagonal length (length: approximately 729 mm, width: approximately 1247 mm).

<Coating Solution for Formation of UV-Absorbing Layer>

Hexafunctional acrylate monomer: 50 parts by mass
(product name: DPHA, manufactured by Sartomer)
Urethane acrylate oligomer: 50 parts by mass
(product name: UV1700B, manufactured by The Nippon Synthetic Chemical Industry Co., Ltd.)
Omnirad 184: 6 parts by mass
(manufactured by IGM Resins B.V.)
Reactive silicone-based leveling agent: 0.1 parts by mass
(product name: UV3500, manufactured by BYK-Chemie GmbH)
Organic fine particles: 3 parts by mass
(average particle diameter: 2.0 μm, spherical polyacrylic-styrene copolymer, manufactured by Sekisui Kasei Co., Ltd.)
Fumed silica: 1 part by mass
(octylsilane-treated, average particle diameter: 12 nm, manufactured by NIPPON AEROSIL CO., LTD.)
UV-absorbing agent B: 6 parts by mass
(benzotriazole-based, product name: JF-79, manufactured by Johoku Chemical Co., Ltd.)
(maximum absorption wavelength: 355 nm)
(wavelengths denoted by −Y and +Y in text of present specification: 300 nm, 377 nm)
Methyl isobutyl ketone: 160 parts by mass
Isopropyl alcohol: 40 parts by mass Next, a PVA film having a film thickness of 200 μm was uniaxially oriented (temperature: 110° C., orientation ratio: 5 times) to obtain a film having a film thickness of 40 μm. This film was soaked in an aqueous solution containing 0.15 g of iodine and 10 g of potassium iodide for 60 seconds, and then soaked in an aqueous solution containing 12 g of potassium iodide and 7.5 g of boric acid at 68° C. The resultant was washed with water and dried to obtain a PVA polarizer.

Next, the surface of a transparent plate A (the optical film of Example 1) on the oriented polyester film A side and the PVA polarizer were adhered together via an adhesive (a PVA aqueous solution with a solid content concentration of 2.5% by mass). Further, a transparent plate B (a TAC film having a thickness of 50 μm) and the other side of the PVA polarizer were adhered together via the same adhesive to obtain a polarizing plate of Example 1. The polarizing plate of Example 1 includes a transparent plate B (a TAC film having a thickness of 50 μm), an adhesive layer, the PVA polarizer, an adhesive layer, and a transparent plate A (the optical film of Example 1, wherein the surface of the optical film on the UV-absorbing layer side with respect to the oriented polyester film A faces the opposite side of the polarizer) in the order presented. In the polarizing plate of Example 1, the absorption axis of the PVA polarizer and the slow axis of the oriented polyester film A were disposed in parallel.

Next, a commercially available image display device ((55UK6300PJF manufactured by LG Electronics: 55 inches) display element: liquid crystal, maximum dimension of effective display area: 1444 mm, resolution: 4K (3840× 2160)), was prepared. The image display device included a polarizing plate on the light source side, a liquid crystal display element, a polarizing plate in the emitting side (a polarizing plate on the visible side), an optical film, and a surface plate in the order presented. The polarizing plate on the emitting side (a polarizing plate on the visible side), the optical film, and the surface plate in the image display device were removed, and the polarizing plate of Example 1 was disposed to obtain an image display device of Example 1. In the image display device, the polarizing plate of Example 1 was disposed in such a manner that the surface on the transparent plate A (the optical film of Example 1) side was on the light emitting surface side.

The image display device of Example 1 includes a polarizing plate on the light source side, a liquid crystal display element, and the polarizing plate of Example 1 in the order presented.

In the present invention, each image display device was placed and fixed on a flat place in such a manner that the long side corresponded to the horizontal direction and was parallel (±5°) with the floor, and subjected to the above evaluations in 1-5 and 1-7.

Example 2

An optical film, polarizing plate, and image display device of Example 2 were obtained in the same manner as in Example 1, except that the oriented polyester film A was replaced with the oriented polyester film B.

Example 3

A UV-absorbing layer was formed on the oriented polyester film D in the same manner as in Example 1.

Next, a coating solution for formation of a hard coat layer with a formulation shown below was applied to the UV-absorbing layer, and then dried at 70° C.×1 minute to volatilize the solvent. Subsequently, UV irradiation (100 mJ/cm$^2$) was performed to form a hard coat layer (dry thickness: 10 μm).

Next, a coating solution for formation of a low-refractive-index layer with a formulation shown below was applied to the hard coat layer, and then dried at 60° C.×1 minute to volatilize the solvent. Subsequently, UV irradiation (200 mJ/cm$^2$) was performed to form a low-refractive-index layer (dry thickness: 100 nm), and thus an optical film, polarizing plate, and image display device of Example 3 were obtained.
<Coating Solution for Formation of Hard Coat Layer>
UV-curable acrylate-containing composition: 22 parts by mass
(manufactured by Nippon Kayaku Co., Ltd., product name "KAYARAD PET-30", solid content: 100%)
UV-curable acrylate-containing composition: 17 parts by mass
(manufactured by DKS Co. Ltd., product name "New Frontier R-1403 MB", solid content: 80%)

Fluorine-containing leveling agent: 1 part by mass
(manufactured by DIC Corporation, product name "MEGAFACE F-568")
Photopolymerization initiator: 1 part by mass
(manufactured by IGM Resins B.V., product name "Omnirad 184")
Methyl isobutyl ketone: 15 parts by mass
Methyl ethyl ketone: 44 parts by mass
<Coating Solution for Formation of Low-Refractive-Index Layer>
Photopolymerization initiator: 0.02 parts by mass
(manufactured by IGM Resins B.V., product name "Omnirad 127")
UV-curable resin: 0.6 parts by mass
(polyethylene glycol (n≈4) diacrylate, manufactured by TOAGOSEI CO., LTD., product name "M-240")
Hollow silica: 6.2 parts by mass (active ingredient: 1.2 parts by mass) (hollow silica surface-treated with silane coupling agent having methacryloyl group and having average particle diameter of 75 nm, dispersion with 20% by mass of active ingredient)
Solid silica: 1.8 parts by mass (active ingredient: 0.7 parts by mass)
(solid silica surface-treated with silane coupling agent having methacryloyl group and having average particle diameter of 12.5 nm, dispersion with 40% by mass of active ingredient)
Silicone-based leveling agent: 0.08 parts by mass
(manufactured by Shin-Etsu Chemical Co., Ltd., product name "KP-420")
Dilution solvent: 91.3 parts by mass
(68:32 mixed solvent of methyl isobutyl ketone and 1-methoxy-2-propyl acetate)

Example 4

An optical film, polarizing plate, and image display device of Example 4 were obtained in the same manner as in Example 1, except that "UV-absorbing agent B (benzotriazole-based, product name: JF-79, manufactured by Johoku Chemical Co., Ltd.): 6 parts by mass" in the coating solution for formation of a UV-absorbing layer was replaced with the following UV-absorbing agent.
<UV-Absorbing Agent in Example 4>
Triazine-based UV-absorbing agent: 10 parts by mass
(product name: Tinuvin 479, manufactured by BASF SE)
(maximum absorption wavelength: 322 nm)
(wavelengths denoted by −Y and +Y in text of present specification: 303 nm, 340 nm)

Comparative Example 1

The oriented polyester film A was prepared as an optical film of Comparative Example 1 (the optical film of Comparative Example 1 is different from the optical film of Example 1 in that the optical film of Comparative Example 1 includes no UV-absorbing layer).

A polarizing plate of Comparative Example 1 was obtained in the same manner as in Example 1, except that in fabrication of the polarizing plate of Example 1, the optical film of Example 1 was replaced with the oriented polyester film A (the optical film of Comparative Example 1). The polarizing plate of Comparative Example 1 includes a transparent plate B (a TAC film having a thickness of 50 μm), an adhesive layer, the PVA polarizer, an adhesive layer, and a transparent plate A (the oriented polyester film A, as the optical film of Comparative Example 1) in the order presented.

An image display device of Comparative Example 1 was obtained in the same manner as in Example 1, except that in fabrication of the image display device of Example 1, the polarizing plate of Example 1 was replaced with the polarizing plate of Comparative Example 1. In the image display device, the polarizing plate of Comparative Example 1 was disposed in such a manner that the surface on the transparent plate A (the oriented polyester film A, as the optical film of Comparative Example 1) side was on the light emitting surface side.

The image display device of Comparative Example 1 includes a polarizing plate on the light source side, a liquid crystal display element, and the polarizing plate of Comparative Example 1 in the order presented.

Comparative Example 2

The oriented polyester film B was prepared as an optical film of Comparative Example 2 (the optical film of Comparative Example 2 is different from the optical film of Example 2 in that the optical film of Comparative Example 2 includes no UV-absorbing layer).

A polarizing plate of Comparative Example 2 was obtained in the same manner as in Example 1, except that in fabrication of the polarizing plate of Example 1, the optical film of Example 1 was replaced with the oriented polyester film B (the optical film of Comparative Example 2). The polarizing plate of Comparative Example 2 includes a transparent plate B (a TAC film having a thickness of 50 μm), an adhesive layer, the PVA polarizer, an adhesive layer, and a transparent plate A (the oriented polyester film B, as the optical film of Comparative Example 2) in the order presented.

An image display device of Comparative Example 2 was obtained in the same manner as in Example 1, except that in fabrication of the image display device of Example 1, the polarizing plate of Example 1 was replaced with the polarizing plate of Comparative Example 2. In the image display device, the polarizing plate of Comparative Example 2 was disposed in such a manner that the surface on the transparent plate A (the oriented polyester film B, as the optical film of Comparative Example 2) side was on the light emitting surface side.

The image display device of Comparative Example 2 includes a polarizing plate on the light source side, a liquid crystal display element, and the polarizing plate of Comparative Example 2 in the order presented.

Comparative Example 3

The oriented polyester film C was prepared as an optical film of Comparative Example 3.

A polarizing plate of Comparative Example 3 was obtained in the same manner as in Example 1, except that in fabrication of the polarizing plate of Example 1, the optical film of Example 1 was replaced with the oriented polyester film C (the optical film of Comparative Example 3). The polarizing plate of Comparative Example 3 includes a transparent plate B (a TAC film having a thickness of 50 μm), an adhesive layer, the PVA polarizer, an adhesive layer, and a transparent plate A (the oriented polyester film C, as the optical film of Comparative Example 3) in the order presented.

An image display device of Comparative Example 3 was obtained in the same manner as in Example 1, except that in fabrication of the image display device of Example 1, the polarizing plate of Example 1 was replaced with the polarizing plate of Comparative Example 3. In the image display device, the polarizing plate of Comparative Example 3 was disposed in such a manner that the surface on the transparent plate A (the oriented polyester film C, as the optical film of Comparative Example 3) side was on the light emitting surface side.

The image display device of Comparative Example 3 includes a polarizing plate on the light source side, a liquid crystal display element, and the polarizing plate of Comparative Example 3 in the order presented.

Comparative Example 4

An optical film, polarizing plate, and image display device of Comparative Example 4 were obtained in the same manner as in Example 1, except that "UV-absorbing agent B (benzotriazole-based, product name: JF-79, manufactured by Johoku Chemical Co., Ltd.): 6 parts by mass" in the coating solution for formation of a UV-absorbing layer was replaced with the following UV-absorbing agent.
<UV-absorbing agent in Comparative Example 4>
Benzoxazinone-based UV-absorbing agent: 6 parts by mass
(product name: CYASORB UV-3638, manufactured by SUN CHEMICAL COMPANY LTD.)
(maximum absorption wavelength: 350 nm)
(wavelengths denoted by −Y and +Y in text of present specification: 320 nm, 360 nm)

Comparative Example 5

An optical film, polarizing plate, and image display device of Comparative Example 5 were obtained in the same manner as in Example 1, except that "UV-absorbing agent B (benzotriazole-based, product name: JF-79, manufactured by Johoku Chemical Co., Ltd.): 6 parts by mass" in the coating solution for formation of a UV-absorbing layer was replaced with the following UV-absorbing agent.
<UV-Absorbing Agent in Comparative Example 5>
Anthracene-based UV-absorbing agent: 6 parts by mass
(product name: UVS-1331, manufactured by Kawasaki Kasei Chemicals Ltd.)
(maximum absorption wavelength: 386 nm)
(wavelengths denoted by −Y and +Y in text of present specification: 381 nm, 390 nm)

TABLE 1

|  | Example | | | | Comparative Example | | | | |
| --- | --- | --- | --- | --- | --- | --- | --- | --- | --- |
|  | 1 | 2 | 3 | 4 | 1 | 2 | 3 | 4 | 5 |
| SL1/BL1 | 0.19 | 0.23 | 0.24 | 0.14 | 1.00 | 1.00 | 1.00 | 0.62 | 0.39 |
| BL1/BL | 0.90 | 0.87 | 0.89 | 0.87 | — | — | — | 0.91 | 0.89 |

TABLE 1-continued

|  | Example | | | | Comparative Example | | | | |
| --- | --- | --- | --- | --- | --- | --- | --- | --- | --- |
|  | 1 | 2 | 3 | 4 | 1 | 2 | 3 | 4 | 5 |
| Presence or absence of UV-absorbing layer | presence | presence | presence | presence | absence | absence | absence | presence | presence |
| Thickness of plastic film (μm) | 28 | 36 | 48 | 28 | 28 | 36 | 80 | 28 | 28 |
| Re (nm) | 373 | 480 | 1100 | 373 | 373 | 480 | 8400 | 373 | 373 |
| Rth (nm) | 4667 | 6000 | 6800 | 4667 | 4667 | 6000 | 9200 | 4667 | 4667 |
| Re/Rth | 0.08 | 0.08 | 0.16 | 0.08 | 0.08 | 0.08 | 0.91 | 0.08 | 0.08 |
| Surface alignment ratio | 1.8 | 1.1 | 2.1 | 1.8 | 1.8 | 1.1 | 7.3 | 1.8 | 1.8 |
| UV transmittance (%) | 0.80 | 0.62 | 0.49 | 0.83 | 6.50 | 4.50 | 10.90 | 0.83 | 0.81 |
| Paleness (edge portion of large screen) | A | A | A | A | C | C | E | B | B |
| Paleness (curved surface) | A | A | A | A | D | D | E | C | C |
| Rainbow unevenness | A | A | A | A | A | A | A | A | A |

It can be confirmed from the results in Table 1 that image display devices incorporating an optical film of any of Examples can suppress the pale appearance of the screen.

The optical film of Example 1 is a product in which a UV-absorbing layer having a thickness of 5 μm is laminated on an oriented polyester film A having a thickness of 28 μm, and the total thickness is 33 μm. The optical film of Example 3 is a product in which a UV-absorbing layer having a thickness of 5 μm, a hard coat layer having a thickness of 10 μm, and a low-refractive-index layer having a thickness of 100 nm were laminated above an oriented polyester film D having a thickness of 48 μm, and the total thickness is 63.1 μm. The folding test described in the text of the present specification wad carried out for the optical films of Example 1 and Example 3.

In the folding test, four types of conditions shown below were combined with each other, and eight test patterns were carried out. The results showed that in four test patterns involving fixing the interval, 4, to 7 mm, both of the optical films of Examples 1 and 3 did not undergo cracking or breaking, and were not creased by folding.

In a test involving fixing the interval, 4, to 3 mm and 300000 cycles of folding, the optical film of Example 1 did not undergo cracking or breaking, and was not creased by folding in any direction of the optical film; for the optical film of Example 3, by contrast, although no cracking or breaking was found, the angle of edge warpage was approximately 20 degrees in any direction of the optical film, indicating the occurrence of slight creasing due to folding.

(Condition 0: direction of folding) Folding along the direction of the slow axis of an oriented polyester film. Condition 0 is a fixed condition.
(Condition 1: direction of optical film) Folding with a UV-absorbing layer being inside or folding with a UV-absorbing layer being outside
(Condition 2: interval, ϕ) 7 mm or 3 mm
(Condition 3: number of cycles of folding) 100000 cycles or 300000 cycles Further, an oriented polyester film E was obtained in the same manner as in the production method for the oriented polyester film A, except that in the production method for the oriented polyester film A, orientation was performed in the longitudinal direction of the film at an orientation ratio of 2.1 times and in the transverse direction of the film at an orientation ratio of 4.8 times, and that the film thickness was set to 48 μm as in Example 3. The in-plane retardation (Re) of this oriented polyester film was 2100 nm.

Above the oriented polyester film E, a UV-absorbing layer having a thickness of 5 μm, a hard coat layer having a thickness of 10 μm, and a low-refractive-index layer having a thickness of 100 nm were laminated in the same manner as in Example 3 to fabricate an optical film.

The above folding test (test in eight patterns of combination of conditions 0 to 3) was carried out for the optical film. For the cases involving fixing the interval, ϕ, to 7 mm, no cracking or breaking was found in both 100000 cycles and 300000 cycles; however, creasing due to folding occurred after 100000 cycles (angle of edge warpage: 40 degrees). For the cases involving fixing the interval, ϕ, to 3 mm, cracking had occurred at the 100000th cycle.

REFERENCE SIGNS LIST

10: optical film
11: plastic film containing UV-absorbing agent A
12: UV-absorbing layer containing UV-absorbing agent B
20: display element
30: polarizing plate
31: polarizer
32: transparent protective plate A
33: transparent protective plate B
50: housing
100: image display device

The invention claimed is:

1. An optical film comprising an UV-absorbing layer containing an UV-absorbing agent B on a plastic film containing an UV-absorbing agent A, wherein the plastic film is a polyester film, and the optical film satisfies the following condition 1:
<Condition 1>
a vertical direction with respect to a plane of the optical film is defined as 0 degrees;
a surface of the optical film on the plastic film side is irradiated with excitation light having a wavelength of 365 nm from a direction of +45 degrees with respect to the vertical direction using a spectrofluorometer, emitted fluorescence from the plastic film is measured from a direction of −45 degrees with respect to the vertical direction, and a sum of intensities of the fluorescence from 380 nm to 490 nm is defined as BL1;

a surface of the optical film on the UV-absorbing layer side is irradiated with excitation light having a wavelength of 365 nm from a direction of +45 degrees with respect to the vertical direction using a spectrofluorometer, emitted fluorescence from the plastic film is measured from a direction of −45 degrees with respect to the vertical direction, and a sum of intensities of the fluorescence from 380 nm to 490 nm is defined as SL1; and under the foregoing premises, BL1 and SL1 satisfy the following formula (1):

$$SL1/BL1 \le 0.30 \qquad (1).$$

2. The optical film according to claim 1, wherein the optical film satisfies the following condition 2:

<Condition 2> the surface of the optical film on the plastic film side is irradiated with excitation light having a wavelength of 365 nm from a direction of +45 degrees with respect to the vertical direction using a spectrofluorometer, emitted fluorescence from the plastic film is measured from a direction of −45 degrees with respect to the vertical direction, and a sum of intensities of the fluorescence from 380 nm to 700 nm is defined as BL; and under the foregoing premises, BL and BL1 satisfy the following formula (2):

$$0.50 \le BL1/BL \qquad (2).$$

3. The optical film according to claim 1, wherein the plastic film is an oriented polyester film.

4. The optical film according to claim 1, wherein a thickness of the plastic film, T, is 15 to 60 μm.

5. The optical film according to claim 1, wherein an in-plane retardation of the plastic film is 500 nm or less.

6. The optical film according to claim 1, wherein an in-plane retardation of the plastic film is defined as Re, a retardation in a thickness direction of the plastic film is defined as Rth, and Re/Rth is 0.10 or less.

7. The optical film according to claim 1, wherein a surface alignment ratio of the plastic film is more than 1.0 and 3.0 or less.

8. The optical film according to claim 1, wherein the optical film comprises a low-refractive-index layer on the UV-absorbing layer.

9. A polarizing plate comprising a polarizer; a transparent protective plate A disposed on one side of the polarizer; and a transparent protective plate B disposed on the other side of the polarizer, wherein at least one of the transparent protective plate A and the transparent protective plate B is the optical film according to claim 1, and the optical film is disposed in such a manner that, with respect to the plastic film, the surface of the optical film on the UV-absorbing layer side faces an opposite side of the polarizer.

10. The polarizing plate according to claim 9, wherein a maximum dimension of the polarizing plate is 1300 mm or larger.

11. A surface plate for an image display device, the surface plate being formed by laminating an optical film on a resin plate or a glass plate, wherein the optical film is the optical film according to claim 1, and the optical film is disposed in such a manner that, with respect to the plastic film, the surface of the optical film on the UV-absorbing layer side faces an opposite side of the resin plate or the glass plate.

12. An image display device comprising a display element and an optical film disposed on a light emitting surface side of the display element, wherein the optical film is an optical film X being the optical film according to claim 1, and the optical film X is disposed in such a manner that, with respect to the plastic film, the surface of the optical film X on the UV-absorbing layer side is on the light emitting surface side.

13. The image display device according to claim 12, wherein a maximum dimension of an effective display area of the image display device is 1300 mm or larger.

14. The image display device according to claim 12, wherein the image display device has a curved shape or is foldable.

15. The image display device according to claim 12, comprising a polarizer between the display element and the optical film X.

* * * * *